(12) United States Patent
Klun et al.

(10) Patent No.: US 10,784,455 B2
(45) Date of Patent: Sep. 22, 2020

(54) COATINGS FOR BARRIER FILMS AND METHODS OF MAKING AND USING THE SAME

(71) Applicant: 3M INNOVATIVE PROPERTIES COMPANY, St. Paul, MN (US)

(72) Inventors: Thomas P. Klun, Lakeland, MN (US); Suresh Iyer, Woodbury, MN (US); Alan K. Nachtigal, Maplewood, MN (US); Joseph C. Spagnola, Woodbury, MN (US); Mark A. Roehrig, Stillwater, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 117 days.

(21) Appl. No.: 15/871,560

(22) Filed: Jan. 15, 2018

(65) Prior Publication Data

US 2018/0138433 A1 May 17, 2018

Related U.S. Application Data

(63) Continuation-in-part of application No. 14/420,227, filed as application No. PCT/US2012/049985 on Aug. 8, 2012, now abandoned.

(51) Int. Cl.
*H01L 51/44* (2006.01)
*B32B 27/08* (2006.01)
(Continued)

(52) U.S. Cl.
CPC ............ *H01L 51/448* (2013.01); *B32B 27/08* (2013.01); *B32B 27/308* (2013.01); *B32B 27/36* (2013.01);
(Continued)

(58) Field of Classification Search
CPC .......... B32B 2037/243; B32B 2457/20; B32B 27/08; B32B 27/308; B32B 27/36;
(Continued)

(56) References Cited

U.S. PATENT DOCUMENTS 4,262,072 A  4/1981 Wendling
4,378,250 A  3/1983 Treadway
(Continued)

FOREIGN PATENT DOCUMENTS

CN   101679461 A   3/2010
JP   H01-110572    4/1989
(Continued)

OTHER PUBLICATIONS

Machine translation of WO 2011/118792, retrieved Oct. 1, 2019.*
(Continued)

*Primary Examiner* — Michael B Nelson
(74) *Attorney, Agent, or Firm* — James A. Baker

(57) ABSTRACT

A barrier film including a substrate, a base (co)polymer layer applied on a major surface of the substrate, an oxide layer applied on the base (co)polymer layer, and a protective (co)polymer layer applied on the oxide layer. The protective (co)polymer layer is formed as the reaction product of a first (meth)acryloyl compound and a (meth)acryl-silane compound derived from a Michael reaction between a second (meth)acryloyl compound and an aminosilane. The first and second (meth)acryloyl compounds may be the same. In some embodiments, a multiplicity of alternating layers of the oxide layer and the protective (co)polymer layer may be used. An oxide layer can be applied over the top protective (co)polymer layer. The barrier films provide, in some embodiments, enhanced resistance to moisture and improved peel strength adhesion of the protective (co) polymer layer(s) to the underlying layers. A process of
(Continued)

US 10,784,455 B2

Page 2 making, and methods of using the barrier film are also described.

16 Claims, 1 Drawing Sheet

(51) Int. Cl.
| | | |
|---|---|---|
| B32B 27/30 | (2006.01) | |
| B32B 27/36 | (2006.01) | |
| C23C 16/44 | (2006.01) | |
| H01L 31/0203 | (2014.01) | |
| H01L 51/52 | (2006.01) | |
| C23C 28/04 | (2006.01) | |
| C23C 16/30 | (2006.01) | |
| C23C 28/00 | (2006.01) | |
| H01L 31/048 | (2014.01) | |
| C08J 7/04 | (2020.01) | |
| H01L 33/56 | (2010.01) | |
| B32B 37/24 | (2006.01) | |

(52) U.S. Cl.
CPC ............ *C08J 7/0423* (2020.01); *C23C 16/30* (2013.01); *C23C 16/44* (2013.01); *C23C 28/00* (2013.01); *C23C 28/042* (2013.01); *H01L 31/0203* (2013.01); *H01L 31/0481* (2013.01); *H01L 51/5256* (2013.01); *B32B 2037/243* (2013.01); *B32B 2457/20* (2013.01); *C08J 2367/02* (2013.01); *C08J 2433/12* (2013.01); *C08J 2483/07* (2013.01); *H01L 33/56* (2013.01)

(58) Field of Classification Search
CPC .......................... C08J 2367/02; C08J 2433/12; C08J 2483/07; C08J 7/045; C23C 16/30; C23C 16/44; C23C 28/00; C23C 28/042; H01L 31/0203; H01L 31/0481; H01L 33/56; H01L 51/448; H01L 51/5256
See application file for complete search history.

(56) References Cited

U.S. PATENT DOCUMENTS

| | | | |
|---|---|---|---|
| 4,696,719 A | 9/1987 | Bischoff | |
| 4,722,515 A | 2/1988 | Ham | |
| 4,842,893 A | 6/1989 | Yializis | |
| 4,954,371 A | 9/1990 | Yializis | |
| 5,018,048 A | 5/1991 | Shaw | |
| 5,032,461 A | 7/1991 | Shaw | |
| 5,097,800 A | 3/1992 | Shaw | |
| 5,125,138 A | 6/1992 | Shaw | |
| 5,142,012 A | 8/1992 | Furukawa | |
| 5,276,108 A * | 1/1994 | Furukawa | C08F 230/08 525/342 |
| 5,440,446 A | 8/1995 | Shaw | |
| 5,547,908 A | 8/1996 | Furuzawa | |
| 5,877,895 A | 3/1999 | Shaw | |
| 5,965,256 A | 10/1999 | Barrera | |
| 6,010,751 A | 1/2000 | Shaw | |
| 6,045,864 A | 4/2000 | Lyons | |
| 6,171,663 B1 | 1/2001 | Hanada | |
| 6,214,422 B1 | 4/2001 | Yializis | |
| 6,231,939 B1 | 5/2001 | Shaw | |
| 6,335,479 B1 | 1/2002 | Yamada | |
| 6,413,645 B1 | 7/2002 | Graff | |
| 6,531,560 B1 | 3/2003 | Campbell | |
| 6,866,901 B2 | 3/2005 | Burrows | |
| 6,926,952 B1 | 8/2005 | Weber | |
| 7,018,713 B2 | 3/2006 | Padiyath | |
| 8,399,102 B2 | 3/2013 | Oertli | |
| 2003/0124392 A1 | 7/2003 | Bright | |
| 2004/0032658 A1 | 2/2004 | Fleming | |
| 2004/0265602 A1 | 12/2004 | Kobayashi | |
| 2006/0003189 A1 | 1/2006 | Kim | |
| 2006/0079605 A1 * | 4/2006 | Sato | C08F 8/42 523/176 |
| 2006/0147177 A1 * | 7/2006 | Jing | C08F 2/44 385/147 |
| 2007/0135572 A1 | 6/2007 | Wolter | |
| 2008/0220264 A1 | 9/2008 | Iyer et al. | |
| 2008/0246189 A1 | 10/2008 | Kuzuhara | |
| 2009/0208719 A1 | 8/2009 | Kang | |
| 2010/0062168 A1 | 3/2010 | Poppe | |
| 2011/0223434 A1 * | 9/2011 | Roehrig | C23C 14/027 428/448 |
| 2012/0003448 A1 | 1/2012 | Weigel | |
| 2012/0003484 A1 | 1/2012 | Roehrig | |
| 2013/0164546 A1 | 6/2013 | Oertli | |

FOREIGN PATENT DOCUMENTS

| | | | |
|---|---|---|---|
| JP | 2003-238795 | | 8/2003 |
| JP | 2004-035591 | | 2/2004 |
| JP | 2008-111025 | | 5/2008 |
| KR | 10-1999-0001415 | | 1/1999 |
| KR | 10-2009-0113576 | | 11/2009 |
| WO | WO 2000-26973 | | 5/2000 |
| WO | WO 01/66656 A2 | | 9/2001 |
| WO | WO 2001-98393 | | 12/2001 |
| WO | WO 2002-102812 | | 12/2002 |
| WO | WO 2008/112400 | * | 12/2008 |
| WO | WO 2010/056559 | | 5/2010 |
| WO | WO 2011/118792 | * | 9/2011 |
| WO | WO 2012-003416 | | 1/2012 |
| WO | WO 2012-003417 | | 1/2012 |
| WO | WO 2012/106184 A4 | | 8/2012 |

OTHER PUBLICATIONS

Affinito, "Polymer-Oxide Transparent Barrier Layers", Society of Vacuum Coaters 39th Annual Technical Conference Proceedings, 1996, pp. 392-397.
Affinito, "Vacuum deposited polymer/metal multilayer films for optical application", Thin Solid Films, 1995, vol. 270, pp. 43-48.
Ling, "Synthesis and Characterization of New Monomers and Polymers Containing Hindered Piperidine Groups", Journal of macromolecular Science Part A, Pure and Applied Chemistry, 1998, vol. A35, No. 7&8, pp. 1327-1336.
Ling, "Synthesis and Polymerization of New Methacryloyl Ureas Carrying a Hindered Piperidine and a Hydroxyl Group", Journal of Macromolecular Science Part A: Pure and Applied Chemistry, 2001, vol. A38, No. 2, pp. 137-158.
Plueddemann, "New Coupling Agents for improved Corrosion Resistant Composites", Polymer-Plastics Technology and Engineering , Sep./Dec. 1986, pp. 223-231.
Shaw, "A New Vapor Deposition Process for Coating Paper and Polymer Webs", Technical paper Presented at the Sixth International Vacuum Web Coating Conference in Reno, Oct. 1992, pp. 18-24.
Shaw, "Use of Evaporated Acrylate Coatings to Smooth the Surface of Polyester and Polypropylene Film Substrates", RadTec' 96 North America UV/EB Conference Proceedings, 1996, vol. 2, pp. 701-707.
Shaw, "Use of Vapor Deposited Acrylate Coatings to Improve the Barrier Properties of Metallized Film", Society of Vacuum Coaters 37th Annual Technical Conference Proceedings, May 1994, pp. 240-247.
Shaw, "A New High Speed Process for Vapor Depositing Acrylate Thin Films: An Update", Society of Vacuum Coaters 36th Annual Technical Conference Proceedings, Apr. 1993; pp. 348-352.
Swanson, "Measurement of Web Curl", Applied Web Handling Conference, 2006, 10 pgs.
International Search Report for PCT International Application No. PCT/US2012/022817, dated Sep. 27, 2012, 3pgs.

(56) References Cited

OTHER PUBLICATIONS

International Search Report for PCT International Application No. PCT/US2012/049985, dated Dec. 10, 2012, 4pgs.

* cited by examiner

COATINGS FOR BARRIER FILMS AND METHODS OF MAKING AND USING THE SAME

CROSS REFERENCE TO RELATED APPLICATIONS

This application is a continuation of U.S. application Ser. No. 14/420,227, filed Apr. 17, 2015, which is a U.S. 371 Application based on PCT/US2012/049985, filed on Aug. 8, 2012, the disclosures of which are incorporated by reference in their entirety herein.

TECHNICAL FIELD

The present disclosure relates to coatings for barrier films, and more particularly, to vapor-deposited protective (co) polymer layers used in barrier films resistant to moisture permeation.

BACKGROUND

Inorganic or hybrid inorganic/organic layers have been used in thin films for electrical, packaging and decorative applications. These layers can provide desired properties such as mechanical strength, thermal resistance, chemical resistance, abrasion resistance, moisture barriers, and oxygen barriers. Highly transparent multilayer barrier coatings have also been developed to protect sensitive materials from damage due to water vapor. The water sensitive materials can be electronic components such as organic, inorganic, and hybrid organic/inorganic semiconductor devices. The multilayer barrier coatings can be deposited directly on the sensitive material, or can be deposited on a flexible transparent substrate such as a (co)polymer film.

Multilayer barrier coatings can be prepared by a variety of production methods. These methods include liquid coating techniques such as solution coating, roll coating, dip coating, spray coating, spin coating; and dry coating techniques such as Chemical Vapor Deposition (CVD), Plasma Enhanced Chemical Vapor Deposition (PECVD), sputtering and vacuum processes for thermal evaporation of solid materials. One approach for multilayer barrier coatings has been to produce multilayer oxide coatings, such as aluminum oxide or silicon oxide, interspersed with thin (co) polymer film protective layers. Each oxide/(co)polymer film pair is often referred to as a "dyad", and the alternating oxide/(co)polymer multilayer construction can contain several dyads to provide adequate protection from moisture and oxygen. Examples of such transparent multilayer barrier coatings and processes can be found, for example, in U.S. Pat. Nos. 5,440,446 (Shaw et al.); 5,877,895 (Shaw et al.); 6,010,751 (Shaw et al.); 7,018,713 (Padiyath et al.); and 6,413,645 (Graff et al.). These barrier films have a number of applications in the display, lighting, and solar markets as flexible replacements for glass encapsulating materials.

SUMMARY

In one aspect, the disclosure describes a barrier film including a substrate, a base (co)polymer layer on a major surface of the substrate, an oxide layer on the base (co) polymer layer; and a protective (co)polymer layer on the oxide layer, the protective (co)polymer layer comprising a reaction product of:

a first (meth)acryloyl compound, and a (meth)acryl-silane compound derived from a Michael reaction between a second (meth)acryloyl compound and an aminosilane.

In some exemplary embodiments, the first (meth)acryloyl compound is different from the second (meth)acryloyl compound. In other exemplary embodiments, the first (meth) acryloyl compound is the same as the second (meth)acryloyl compound. An optional inorganic layer, which preferably is an oxide layer, can be applied over the protective (co) polymer layer.

In another aspect, the disclosure describes a process for making a barrier film, the process including:

(a) applying a base (co)polymer layer to a major surface of a substrate;

(b) applying an oxide layer on the base (co)polymer layer; and (c) depositing on the oxide layer a first (meth)acryloyl compound and a (meth)acryl-silane compound derived from a Michael reaction between a second (meth)acryloyl compound and an aminosilane, and reacting the (meth)acryl-silane compound with the first (meth)acryloyl compound to form a protective (co)polymer layer on the oxide layer.

In one exemplary presently preferred embodiment, the disclosure describes a process for making a barrier film, the process including:

(a) vapor depositing and curing a base (co)(co)polymer layer onto a major surface of a substrate;

(b) vapor depositing an oxide layer on the base (co)(co) polymer layer; and (c) vapor depositing on the oxide layer a first (meth) acryloyl compound and a (meth)acryl-silane compound derived from a Michael reaction between a second (meth) acryloyl compound and an aminosilane, and reacting the (meth)acryl-silane compound with the first (meth)acryloyl compound to form a protective (co)polymer layer on the oxide layer.

In some exemplary embodiments, the first (meth)acryloyl compound is different from the second (meth)acryloyl compound. In other exemplary embodiments, the first (meth) acryloyl compound is the same as the second (meth)acryloyl compound. An optional inorganic layer, which preferably is an oxide layer, can be applied over the protective (co) polymer layer.

In a further aspect, the disclosure describes methods of using a barrier film made as described above in an article selected from a photovoltaic device, a display device, a solid state lighting device, and combinations thereof.

Exemplary embodiments of the present disclosure provide barrier films which exhibit improved moisture resistance when used in moisture barrier applications. Exemplary embodiments of the disclosure can enable the formation of barrier films that exhibit superior mechanical properties such as elasticity and flexibility yet still have low oxygen or water vapor transmission rates. Exemplary embodiments of barrier films according to the present disclosure are preferably transmissive to both visible and infrared light. Exemplary embodiments of barrier films according to the present disclosure are also typically flexible. Exemplary embodiments of barrier films according to the present disclosure generally do not exhibit delamination or curl that can arise from thermal stresses or shrinkage in a multilayer structure. The properties of exemplary embodiments of barrier films disclosed herein typically are maintained even after high temperature and humidity aging.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The accompanying drawings are incorporated in and constitute a part of this specification and, together with the description, explain the advantages and principles of exemplary embodiments of the present disclosure.

Like reference numerals in the drawings indicate like elements. The drawings herein are not drawn to scale, and in the drawings, the illustrated elements are sized to emphasize selected features.

DETAILED DESCRIPTION

Glossary

Figure 1:
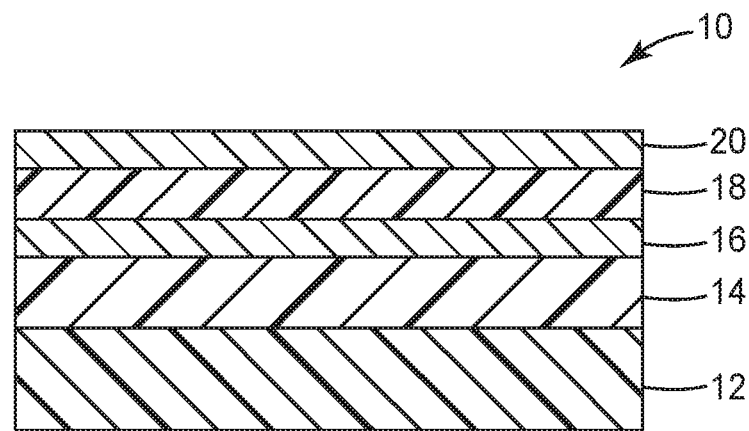
FIG. 1 is a diagram illustrating an exemplary moisture-resistant barrier film having a vapor-deposited adhesion-promoting coating according to an exemplary embodiment of the present disclosure.

Certain terms are used throughout the description and the claims that, while for the most part are well known, may require some explanation. It should understood that, as used herein, The words "a", "an", and "the" are used interchangeably with "at least one" to mean one or more of the elements being described.

By using words of orientation such as "atop", "on", "covering", "uppermost", "underlying" and the like for the location of various elements in the disclosed coated articles, we refer to the relative position of an element with respect to a horizontally-disposed, upwardly-facing substrate. It is not intended that the substrate or articles should have any particular orientation in space during or after manufacture.

By using the term "overcoated" to describe the position of a layer with respect to a substrate or other element of a barrier film of the disclosure, we refer to the layer as being atop the substrate or other element, but not necessarily contiguous to either the substrate or the other element.

By using the term "separated by" to describe the position of a (co)polymer layer with respect to two inorganic barrier layers, we refer to the (co)polymer layer as being between the inorganic barrier layers but not necessarily contiguous to either inorganic barrier layer.

The term "barrier film" or "barrier layer" refers to a film or layer which is designed to be impervious to vapor, gas or aroma migration. Exemplary gases and vapors that may be excluded include oxygen and/or water vapor.

The term "(meth)acryl-silane" or "methacryloyl compound" includes silanes or compounds, respectively, that comprise one or more acrylic and/or methacrylic functional groups: $-AC(O)C(R)=CH_2$, preferably wherein A is O, S or NR; and R is a 1-4 carbon lower alkyl group, H or F.

The term "(meth)acrylate" with respect to a monomer, oligomer or compound means a vinyl-functional alkyl ester formed as the reaction product of an alcohol with an acrylic or a methacrylic acid.

The term "polymer" or "(co)polymer" includes homopolymers and copolymers, as well as homopolymers or copolymers that may be formed in a miscible blend, e.g., by coextrusion or by reaction, including, e.g., transesterification. The term "copolymer" includes both random and block copolymers.

The term "cure" refers to a process that causes a chemical change, e.g., a reaction via consumption of water, to solidify a film layer or increase its viscosity.

The term "crosslinked" (co)polymer refers to a (co)polymer whose (co)polymer chains are joined together by covalent chemical bonds, usually via crosslinking molecules or groups, to form a network (co)polymer. A crosslinked (co)polymer is generally characterized by insolubility, but may be swellable in the presence of an appropriate solvent.

The term "cured (co)polymer" includes both crosslinked and uncrosslinked polymers.

By using the term "$T_g$", we refer to the glass transition temperature of a cured (co)polymer when evaluated in bulk rather than in a thin film form. In instances where a (co)polymer can only be examined in thin film form, the bulk form $T_g$ can usually be estimated with reasonable accuracy. Bulk form $T_g$ values usually are determined by evaluating the rate of heat flow vs. temperature using differential scanning calorimetry (DSC) to determine the onset of segmental mobility for the (co)polymer and the inflection point (usually a second-order transition) at which the (co)polymer can be said to change from a glassy to a rubbery state. Bulk form $T_g$ values can also be estimated using a dynamic mechanical thermal analysis (DMTA) technique, which measures the change in the modulus of the (co)polymer as a function of temperature and frequency of vibration.

By using the term "visible light-transmissive" support, layer, assembly or device, we mean that the support, layer, assembly or device has an average transmission over the visible portion of the spectrum, $T_{vis}$, of at least about 20%, measured along the normal axis.

The term "metal" includes a pure metal or a metal alloy.

The term "vapor coating" or "vapor depositing" means applying a coating to a substrate surface from a vapor phase, for example, by evaporating and subsequently depositing onto the substrate surface a precursor material to the coating or the coating material itself. Exemplary vapor coating processes include, for example, physical vapor deposition (PVD), chemical vapor deposition (CVD), and combinations thereof.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Flexible barrier coatings or films are desirable for electronic devices whose components are sensitive to the ingress of water vapor. A multilayer barrier coating or film may provide advantages over glass as it is flexible, light-weight, durable, and enables low cost continuous roll-to-roll processing.

Each of the known methods for producing a multilayer barrier coating or film has limitations. Chemical deposition methods (CVD and PECVD) form vaporized metal alkoxide precursors that undergo a reaction, when adsorbed on a substrate, to form inorganic coatings. These processes are generally limited to low deposition rates (and consequently low line speeds), and make inefficient use of the alkoxide precursor (much of the alkoxide vapor is not incorporated into the coating). The CVD process also requires high substrate temperatures, often in the range of 300-500° C., which may not be suitable for (co)polymer substrates.

Vacuum processes such as thermal evaporation of solid materials (e.g., resistive heating or e-beam heating) also provide low metal oxide deposition rates. Thermal evaporation is difficult to scale up for roll wide web applications requiring very uniform coatings (e.g., optical coatings) and can require substrate heating to obtain quality coatings. Additionally, evaporation/sublimation processes can require ion-assist, which is generally limited to small areas, to improve the coating quality.

Sputtering has also been used to form metal oxide layers. While the deposition energy of the sputter process used for forming the barrier oxide layer is generally high, the energy involved in depositing the (meth)acrylate layers is generally low. As a result the (meth)acrylate layer typically does not have good adhesive properties with the layer below it, for example, an inorganic barrier oxide sub-layer. To increase the adhesion level of the protective (meth)acrylate layer to the barrier oxide, a thin sputtered layer of silicon sub-oxide is known to be useful in the art. If the silicon sub oxide layer is not included in the stack, the protective (meth)acrylate layer has poor initial adhesion to the barrier oxide. The silicon sub oxide layer sputter process must be carried out with precise power and gas flow settings to maintain adhesion performance. This deposition process has historically been susceptible to noise resulting in varied and low adhesion of the protective (meth)acrylate layer. It is therefore desirable to eliminate the need for a silicon sub oxide layer in the final barrier construct for increased adhesion robustness and reduction of process complexity.

Even when the "as deposited" adhesion of the standard barrier stack is initially acceptable, the sub oxide and protective (meth)acrylate layer has demonstrated weakness when exposed to accelerated aging conditions of 85° C./85% relative humidity (RH). This inter-layer weakness can result in premature delamination of the barrier film from the devices it is intended to protect. It is desirable that the multi-layer construction improves upon and maintains initial adhesion levels when aged in 85° C. and 85%RH.

One solution to this problem is to use what is referred to as a "tie" layer of particular elements such chromium, zirconium, titanium, silicon and the like, which are often sputter deposited as a mono- or thin-layer of the material either as the element or in the presence of small amount of oxygen. The tie layer element can then form chemical bonds to both the substrate layer, an oxide, and the capping layer, a (co)polymer.

Tie layers are generally used in the vacuum coating industry to achieve adhesion between layers of differing materials. The process used to deposit the layers often requires fine tuning to achieve the right layer concentration of tie layer atoms. The deposition can be affected by slight variations in the vacuum coating process such as fluctuation in vacuum pressure, out-gassing, and cross contamination from other processes resulting in variation of adhesion levels in the product. In addition, tie layers often do not retain their initial adhesion levels after exposure to water vapor. A more robust solution for adhesion improvement in barrier films is desirable.

Barrier Films

Thus, in one aspect, the disclosure describes a barrier film comprising a substrate, a base (co)polymer layer on a major surface of the substrate, an oxide layer on the base (co)polymer layer; and a protective (co)polymer layer on the oxide layer, the protective (co)polymer layer comprising a reaction product of:
  a first (meth)acryloyl compound, and
  a (meth)acryl-silane compound derived from a Michael reaction between a second (meth)acryloyl compound and an aminosilane,
  optionally wherein the first (meth)acryloyl compound is the same as the second (meth)acryloyl compound.

In some exemplary embodiments, the first (meth)acryloyl compound is different from the second (meth)acryloyl compound. In other exemplary embodiments, the first (meth)acryloyl compound is the same as the second (meth)acryloyl compound. An optional inorganic layer, which preferably is an oxide layer, can be applied over the protective (co)polymer layer. Presently preferred inorganic layers comprise at least one of silicon aluminum oxide or indium tin oxide.

In certain exemplary embodiments, the barrier film comprises a plurality of alternating layers of the oxide layer and the protective (co)polymer layer on the base (co)polymer layer. The oxide layer and protective (co)polymer layer together form a "dyad", and in one exemplary embodiment, the barrier film can include more than one dyad, forming a multilayer barrier film. Each of the oxide layers and/or protective (co)polymer layers in the multilayer barrier film (i.e. including more than one dyad) can be the same or different. An optional inorganic layer, which preferably is an oxide layer, can be applied over the plurality of alternating layers or dyads.

Turning to the drawings, FIG. 1 is a diagram of a barrier film 10 having a moisture resistant coating comprising a single dyad. Film 10 includes layers arranged in the following order: a substrate 12; a base (co)polymer layer 14; an oxide layer 16; a protective (co)polymer layer 18; and an optional oxide layer 20. Oxide layer 16 and protective (co)polymer layer 18 together form a dyad and, although only one dyad is shown, film 10 can include additional dyads of alternating oxide layer 16 and protective (co)polymer layer 18 between substrate 10 and the uppermost dyad.

The first (meth)acryloyl compound and the (meth)acrylsilane compound derived from a Michael reaction between a second (meth)acryloyl compound and an aminosilane, may be co-deposited or sequentially deposited to form protective (co)polymer layer 18, which in some exemplary embodiments, improves the moisture resistance of film 10 and the peel strength adhesion of protective (co)polymer layer 18 to the underlying oxide layer, leading to improved adhesion and delamination resistance within the further barrier stack layers, as explained further below. Presently preferred materials for use in the barrier film 10 are also identified further below, and in the Examples.

Substrates

Substrate 12 can be a flexible, visible light-transmissive substrate, such as a flexible light transmissive polymeric film. In one presently preferred exemplary embodiment, the substrates are substantially transparent, and can have a visible light transmission of at least about 50%, 60%, 70%, 80%, 90% or even up to about 100% at 550 nm.

Exemplary flexible light-transmissive substrates include thermoplastic polymeric films including, for example, polyesters, poly(meth)acrylates (e.g., polymethyl (meth)acrylate), polycarbonates, polypropylenes, high or low density polyethylenes, polysulfones, polyether sulfones, polyurethanes, polyamides, polyvinyl butyral, polyvinyl chloride, fluoropolymers (e.g., polyvinylidene difluoride, ethylenetetrafluoroethylene (ETFE) (co)polymers, terafluoroethylene (co)polymers, hexafluoropropylene (co)polymers, polytetrafluoroethylene, and copolymers thereof), polyethylene sulfide, cyclic olefin (co)polymers, and thermoset films such as epoxies, cellulose derivatives, polyimide, polyimide benzoxazole and polybenzoxazole.

Presently preferred polymeric films comprise polyethylene terephthalate (PET), polyethylene napthalate (PEN), heat stabilized PET, heat stabilized PEN, polyoxymethylene, polyvinylnaphthalene, polyetheretherketone, fluoropolymer, polycarbonate, polymethyl(meth)acrylate, poly α-methyl styrene, polysulfone, polyphenylene oxide, polyetherimide, polyethersulfone, polyamideimide, polyimide, polyphthalamide, or combinations thereof.

In some exemplary embodiments, the substrate can also be a multilayer optical film ("MOF"), such as those described in U.S. Patent Application Publication No. US 2004/0032658 A1. In one exemplary embodiment, the films can be prepared on a substrate including PET.

The substrate may have a variety of thicknesses, e.g., about 0.01 to about 1 mm. The substrate may however be considerably thicker, for example, when a self-supporting article is desired. Such articles can conveniently also be made by laminating or otherwise joining a disclosed film made using a flexible substrate to a thicker, inflexible or less flexible supplemental support.

The polymeric film can be heat-stabilized, using heat setting, annealing under tension, or other techniques that will discourage shrinkage up to at least the heat stabilization temperature when the polymeric film is not constrained.

Base (co)polymer Layer

Returning to FIG. 1, the base (co)polymer layer 14 can include any (co)polymer suitable for deposition in a thin film. In one aspect, for example, the base (co)polymer layer 14 can be formed from various precursors, for example, (meth)acrylate monomers and/or oligomers that include (meth)acrylates or (meth)acrylates such as urethane (meth) acrylates, isobornyl (meth)acrylate, dipentaerythritol penta (meth)acrylates, epoxy (meth)acrylates, epoxy (meth)acrylates blended with styrene, di-trimethylolpropane tetra (meth)acrylates, diethylene glycol di(meth)acrylates, 1,3-butylene glycol di(meth)acrylate, penta(meth)acrylate esters, pentaerythritol tetra(meth)acrylates, pentaerythritol tri(meth)acrylates, ethoxylated (3) trimethylolpropane tri (meth)acrylates, ethoxylated (3) trimethylolpropane tri (meth)acrylates, alkoxylated trifunctional (meth)acrylate esters, dipropylene glycol di(meth)acrylates, neopentyl glycol di(meth)acrylates, ethoxylated (4) bisphenol A (meth) acrylates, tricyclodecanedimethanol di(meth)acrylates, cyclohexane dimethanol di(meth)acrylate esters, isobornyl (meth)acrylate, cyclic di(meth)acrylates and tris (2-hydroxy ethyl) isocyanurate tri(meth)acrylate, (meth)acrylates of the foregoing (meth)acrylates and (meth)acrylates of the foregoing (meth)acrylates. Preferably, the base (co)polymer precursor comprises a (meth)acrylate monomer.

The base (co)polymer layer 14 can be formed by applying a layer of a monomer or oligomer to the substrate and crosslinking the layer to form the (co)polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the substrate.

The monomer or oligomer can also be applied to the substrate 12 using conventional coating methods such as roll coating (e.g., gravure roll coating) or spray coating (e.g., electrostatic spray coating), then crosslinked as set out above. The base (co)polymer layer 14 can also be formed by applying a layer containing an oligomer or (co)polymer in solvent and drying the thus-applied layer to remove the solvent. Plasma Enhanced Chemcal Vapor Deposition (PECVD) may also be employed in some cases.

Preferably, the base (co)polymer layer 14 is formed by flash evaporation and vapor deposition followed by crosslinking in situ, e.g., as described in U.S. Pat. Nos. 4,696,719 (Bischoff), 4,722,515 (Ham), 4,842,893 (Yializis et al.), 4,954,371 (Yializis), 5,018,048

(Shaw et al.), 5,032,461(Shaw et al.), 5,097,800 (Shaw et al.), 5,125,138 (Shaw et al.), 5,440,446 (Shaw et al.), 5,547,908 (Furuzawa et al.), 6,045,864 (Lyons et al.), 6,231, 939 (Shaw et al. and 6,214,422 (Yializis); in PCT International Publication No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum Deposited Polymer/Metal Multilayer Films for Optical Application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

In some exemplary embodiments, the smoothness and continuity of the base (co)polymer layer 14 (and also each oxide layer 16 and protective (co)polymer layer 18) and its adhesion to the underlying substrate or layer may be enhanced by appropriate pretreatment. Examples of a suitable pretreatment regimen include an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric (or inorganic) layer. Plasma pretreatment can be particularly useful.

In some exemplary embodiments, a separate adhesion promotion layer which may have a different composition than the base (co)polymer layer 14 may also be used atop the substrate or an underlying layer to improve adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the base (co)polymer layer will depend in part on the nature and surface topography of the substrate. The thickness preferably is sufficient to provide a smooth, defect-free surface to which the subsequent oxide layer can be applied. For example, the base (co)polymer layer may have a thickness of a few nm (e.g., 2 or 3 nm) to about 5 micrometers, and can be thicker if desired.

As described elsewhere, the barrier film can include the oxide layer deposited directly on a substrate that includes a moisture sensitive device, a process often referred to as direct encapsulation. The moisture sensitive device can be, for example, an organic, inorganic, or hybrid organic/inorganic semiconductor device including, for example, a photovoltaic device such as a copper indium gallium di-selenide (CIGS) photovoltaic device; a display device such as an organic light emitting diode (OLED), electrochromic, or an electrophoretic display; an OLED or other electroluminescent solid state lighting device, or others. Flexible electronic devices can be encapsulated directly with the gradient composition oxide layer. For example, the devices can be attached to a flexible carrier substrate, and a mask can be deposited to protect electrical connections from the oxide layer deposition. The base (co)polymer layer 14, the oxide layer 16 and the protective (co)polymer layer 18 can be deposited as described further below, and the mask can then be removed, exposing the electrical connections.

Oxide Layers

The improved barrier film includes at least one oxide layer 16. The oxide layer preferably comprises at least one inorganic material. Suitable inorganic materials include oxides, nitrides, carbides or borides of different atomic elements. Presently preferred inorganic materials included in the oxide layer comprise oxides, nitrides, carbides or borides of atomic elements from Groups IIA, IIIA, IVA, VA, VIA, VIIA, IB, or IIB, metals of Groups IIIB, IVB, or VB, rare-earth metals, or combinations thereof. In some particular exemplary embodiments, an inorganic layer, more preferably an inorganic oxide layer, may be applied to the uppermost protective (co)polymer layer. Preferably, the oxide layer comprises silicon aluminum oxide or indium tin oxide.

In some exemplary embodiments, the composition of the oxide layer may change in the thickness direction of the layer, i.e. a gradient composition. In such exemplary embodiments, the oxide layer preferably includes at least two inorganic materials, and the ratio of the two inorganic materials changes throughout the thickness of the oxide layer. The ratio of two inorganic materials refers to the relative proportions of each of the inorganic materials. The ratio can be, for example, a mass ratio, a volume ratio, a concentration ratio, a molar ratio, a surface area ratio, or an atomic ratio.

The resulting gradient oxide layer is an improvement over homogeneous, single component layers. Additional benefits in barrier and optical properties can also be realized when combined with thin, vacuum deposited protective (co)polymer layers. A multilayer gradient inorganic-(co)polymer barrier stack can be made to enhance optical properties as well as barrier properties.

The barrier film can be fabricated by deposition of the various layers onto the substrate, in a roll-to-roll vacuum chamber similar to the system described in U.S. Pat. Nos. 5,440,446 (Shaw et al.) and 7,018,713 (Padiyath, et al.). The deposition of the layers can be in-line, and in a single pass through the system. In some cases, the barrier film can pass through the system several times, to form a multilayer barrier film having several dyads.

The first and second inorganic materials can be oxides, nitrides, carbides or borides of metal or nonmetal atomic elements, or combinations of metal or nonmetal atomic elements. By "metal or nonmetal" atomic elements is meant atomic elements selected from the periodic table Groups IIA, IIIA, IVA, VA, VIA, VIIA, IB, or IIB, metals of Groups IIIB, IVB, or VB, rare-earth metals, or combinations thereof.

Suitable inorganic materials include, for example, metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, aluminum nitride, silicon nitride, boron nitride, aluminum oxynitride, silicon oxynitride, boron oxynitride, zirconium oxyboride, titanium oxyboride, and combinations thereof. ITO is an example of a special class of ceramic materials that can become electrically conducting with the proper selection of the relative proportions of each elemental constituent. Silicon-aluminum oxide and indium tin oxide are presently preferred inorganic materials forming the oxide layer 16.

For purposes of clarity, the oxide layer 16 described in the following discussion is directed toward a composition of oxides; however, it is to be understood that the composition can include any of the oxides, nitrides, carbides, borides, oxynitrides, oxyborides and the like described above.

In one embodiment of the oxide layer 16, the first inorganic material is silicon oxide, and the second inorganic material is aluminum oxide. In this embodiment, the atomic ratio of silicon to aluminum changes throughout the thickness of the oxide layer, e.g., there is more silicon than aluminum near a first surface of the oxide layer, gradually becoming more aluminum than silicon as the distance from the first surface increases. In one embodiment, the atomic ratio of silicon to aluminum can change monotonically as the distance from the first surface increases, i.e., the ratio either increases or decreases as the distance from the first surface increases, but the ratio does not both increase and decrease as the distance from the first surface increases. In another embodiment, the ratio does not increase or decrease monotonically, i.e. the ratio can increase in a first portion, and decrease in a second portion, as the distance from the first surface increases. In this embodiment, there can be several increases and decreases in the ratio as the distance from the first surface increases, and the ratio is non-monotonic. A change in the inorganic oxide concentration from one oxide species to another throughout the thickness of the oxide layer 16 results in improved barrier performance, as measured by water vapor transmission rate.

In addition to improved barrier properties, the gradient composition can be made to exhibit other unique optical properties while retaining improved barrier properties. The gradient change in composition of the layer produces corresponding change in refractive index through the layer. The materials can be chosen such that the refractive index can change from high to low, or vice versa. For example, going from a high refractive index to a low refractive index can allow light traveling in one direction to easily pass through the layer, while light travelling in the opposite direction may be reflected by the layer. The refractive index change can be used to design layers to enhance light extraction from a light emitting device being protected by the layer. The refractive index change can instead be used to pass light through the layer and into a light harvesting device such as a solar cell. Other optical constructions, such as band pass filters, can also be incorporated into the layer while retaining improved barrier properties. In order to promote silane bonding to the oxide surface, it is desirable to form hydroxyl silanol (Si—OH) groups on a freshly sputter deposited silicon dioxide ($SiO_2$) layer. The amount of water vapor present in a multi-process vacuum chamber can be controlled sufficiently to promote the formation of Si-OH groups in high enough surface concentration to provide increased bonding sites. With residual gas monitoring and the use of water vapor sources the amount of water vapor in a vacuum chamber can be controlled to ensure adequate generation of Si—OH groups.

Protective (co)polymer Layers

The protective (co)polymer layer is formed as the reaction product of a first (meth)acryloyl compound and a (meth) acryl-silane compound derived from a Michael reaction between a second (meth)acryloyl compound and an aminosilane. The first and second (meth)acryloyl compounds may be the same.

The (meth)acrylate vapor deposition process is limited to chemistries that are pumpable (liquid-phase with an acceptable viscosity); that can be atomized (form small droplets of liquid), flash evaporated (high enough vapor pressure under vacuum conditions), condensable (vapor pressure, molecular weight), and can be cross-linked in vacuum (molecular weight range, reactivity, functionality).

A solution to this problem was found by chemically modifying the (meth)acrylate used in the coating process to 1) achieve a robust chemical bond with an inorganic oxide surface, 2) achieve a robust chemical bond to the (meth) acrylate coating through polymerization, and 3) maintain the physical properties of the modified molecules such that they can be co-evaporated with the bulk (meth)acrylate material.

(Meth)acryloyl Compounds

Useful nucleophilic acryloyl compounds include, for example, (meth)acrylate compounds selected from the group consisting of multi-(meth)acryloyl-containing compounds such as tricyclodecanedimethanol di(meth)acrylate, 3-(acryloxy)-2-hydroxy-propyl(meth)acrylate, 3-(acryloxy)-2-acetoxy-propyl(meth)acrylate, triacryloxyethyl isocyanurate, glycerol di(meth)acrylate, ethoxylated tri(meth)acrylates (e.g., ethoxylated trimethylolpropane di(meth)acrylate), pentaerythritol tri(meth)acrylate, propoxylated di(meth) acrylates (e.g., propoxylated (3) glyceryl di(meth)acrylate, propoxylated (5,5) glyceryl di(meth)acrylate, propoxylated (3) trimethylolpropane di(meth)acrylate, propoxylated (6) trimethylolpropane di(meth)acrylate), trimethylolpropane di(meth)acrylate, 1-acryloxy-2-methacryloxy ethane, 1-acryloxy-4-methacryloxy butane, and higher functionality (meth)acryl containing compounds such as di-trimethylolpropane tetra(meth)acrylate, and dipentaerythritol penta(meth)acrylate.

Such compounds are widely available from vendors such as, for example, Sartomer Company, Exton, Pa.; UCB Chemicals Corporation, Smyrna, Ga.; and Aldrich Chemical Company, Milwaukee, Wis., or can be prepared by standard methods. Additional useful (meth)acrylate materials include dihydroxyhydantoin moiety-containing poly(meth)acrylates, for example, as described in U.S. Pat. No. 4,262,072 (Wendling et al.).

A presently preferred (meth)acryloyl compound is Sartomer SR833S (tricyclodecanedimethanol di(meth)acrylate):

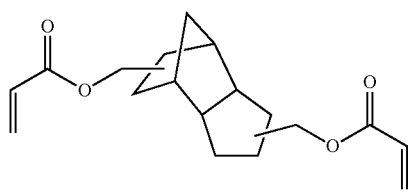

Aminosilanes

Especially useful in the practice of the presently described embodiments, as materials for Michael addition to poly (meth)acrylates, are the secondary amino silanes that include N-methyl aminopropyltrimethoxy silane, N-methyl aminopropyltriethoxy silane, Bis(propyl-3-trimethoxysilane) amine, Bis(propyl-3-triethoxysilane) amine, N-butyl aminopropyltrimethoxy silane, N-butyl minopropyltriethoxy silane, N-cyclohexyl aminopropyltrimethoxy silane, N-cyclohexyl aminomethyltrimethoxy silane, N-cyclohexyl aminomethyltriethoxy silane, N-cyclohexyl aminomethyldiethoxy monomethyl silane.

Other aminosilanes useful in the practice of this disclosure are described in U.S. Pat. No. 4,378,250 (Treadway et al.) and include aminoethyltriethoxysilane, β-aminoethyltrimethoxysilane, β-aminoethyltriethoxysilane, β-aminoethyltributoxysilane, β-aminoethyltripropoxysilane, α-aminoethyltrimethoxysilane, α-aminoethyltriethoxy-silane, γ-aminopropyltrimethoxysilane, γ-aminopropyltrimethoxysilane, γ-aminopropyltriethoxysilane, γ-aminopropyltributoxysilane, γ-aminopropyltripropoxysilane, β-aminopropyltrimethoxysilane, β-aminopropyltriethoxysilane, β-aminopropyltripropoxysilane, β-aminopropyltributoxysilane, α-aminopropyltrimethoxysilane, α-aminopropyltriethoxysilane, α-aminopropyltributoxysilane, and α-aminopropyltripropoxysilane.

Minor amounts (<20 mole percent) of catenary nitrogen-containing aminosilanes may also be used, including those described in U.S. Pat. No. 4,378,250 (Treadway et al. N-(β-aminoethyl)-β-aminoethyltrimethoxysilane, N-(β-aminoethyl)-β-aminoethyltriethoxysilane, N-(β-aminoethyl)-β-aminoethyltripropoxysilane, N-(β-aminoethyl)-α-aminoethyltrimethoxysilane, N-(β-aminoethyl)-α-aminoethyltriethoxysilane, N-(β-aminoethyl)-α-aminoethyltripropoxysilane, N-(β-aminoethyl)-β-aminopropyltrimethoxysilane, N-(β-aminoethyl)-γ-aminopropyltriethoxysilane, N-(β-aminoethyl)-γ-aminopropyltripropoxysilane, N-(β-aminoethyl)-γ-aminopropyltrimethoxysilane, N-(β-aminoethyl)-β-aminopropyltriethoxysilane, N-(β-aminoethyl)-β-aminopropyltripropoxysilane, N-(γ-aminopropyl)-β-aminoethyltrimethoxysilane, N-(γ-aminopropyl)-β-aminoethyltriethoxysilane, N-(γ-aminopropyl)-β-aminoethyltripropoxysilane, N-methylaminopropyltrimethoxysilane, β-aminopropylmethyldiethoxysilane, and γ-diethylene triaminepropyltriethoxysilane.

(Meth)acryl-silane Compounds

Particularly useful in practicing embodiments of the present disclosure are (meth)acryl-silane compounds derived from a Michael reaction between a methacryloyl compound (e.g. as described above) and an aminosilane (as described below), the (meth)acryl-silane compound described by the following general formula I:

$$(R_m)_x\text{—}R^1\text{—}(R^2)_y \qquad\qquad\qquad I$$

wherein x and y are each independently at least 1;

$R_m$ is a (meth)acryl group comprising the formulas —$X^2$-C(O)C($R^3$)=$CH_2$, where $X^2$ is —O, —S, or —$NR^3$, where $R^3$ is H, or $C_1$-$C_4$;

$R^1$ is a covalent bond, a polyvalent alkylene, (poly)cycloalkylene, heterocyclic, or arylene group, or combinations thereof, said alkylene groups optionally containing one or more catenary oxygen or nitrogen atoms, or pendant hydroxyl groups; and $R^2$ is a silane-containing group derived from the Michael reaction between an aminosilane and an acryloyl group of the formula II:

wherein $X^2$ is —O—, —S—, or —$NR^3$, where $R^3$ is H, or $C_1$-$C_4$ alkyl, $R^4$ is $C_1$-$C_6$ alkyl or cycloalkyl, or —$R^5$—$Si(Y_p)(R^6)_{3-p}$, or $(R_m)_x$—$R^1$—$X^2$—C(O)—$CH_2CH_2$—;

$R^5$ is a divalent alkylene group, said alkylene groups optionally containing one or more catenary oxygen or nitrogen atoms, Y is a hydrolysable group, $R^6$ is a monovalent alkyl or aryl group; and p is 1,2, or 3.

The hydrolysable groups Y on silicon include alkoxy groups, acetate groups, aryloxy groups, and halogens, especially chlorine.

Michael Addition Reaction Products

The (meth)acrylate vapor deposition process is limited to chemistries that are pumpable (liquid-phase with an acceptable viscosity); that can be atomized (form small droplets of liquid), flash evaporated (high enough vapor pressure under vacuum conditions), condensable (vapor pressure, molecular weight), and can be cross-linked in vacuum (molecular weight range, reactivity, functionality).

The approach was to chemically modify the (meth)acrylate used in the coating process to achieve 1) a robust chemical bond with an inorganic oxide surface, 2) a robust chemical bond to the (meth)acrylate coating through polymerization, and 3) maintain the physical properties of the modified molecules such that they can be co-evaporated with the bulk (meth)acrylate material.

Conveniently with multi(meth)acrylates (with no (meth)acrylate functionality present) the aminosilane is added to a molar excess of the multi(meth)acrylate, preferably a ratio of amino silane: multi(meth)acrylate of at least 1:3 to 1:5 to 1:10 to 1:15 to 1:20. In general, the reactive components, and optionally a solvent, are charged to a dry reaction vessel in immediate succession or as pre-made mixtures. In some cases, the multi(meth)acrylate and optionally a solvent are charged to a dry reaction vessel followed by slow addition of the aminosilane. The reaction mixture may be heated, typically at 30-60 degrees Centigrade, optionally with a catalyst, for a time sufficient for the reaction to occur. Progress of the reaction can be determined by monitoring the reaction by Fourier transform NMR.

Although no catalyst is generally required for the Michael addition of the aminosilanes to the acryloyl groups, suitable catalysts for the Michael reaction is a base of which the conjugated acid preferably has a $pK_a$ between 12 and 14. In many convenient embodiments, the bases are organic. Examples of such bases are 1,4-dihydropyridines, methyl diphenylphosphane, methyl di-p-tolylphosphane, 2-allyl-N-alkyl imidazolines, tetra-t-butylammonium hydroxide, DBU (1,8-diazabicyclo[5.4.0]undec-7-ene) and DBN (1,5-diazabicyclo[4.3.0]non-5-ene), potassium methoxide, sodium methoxide, sodium hydroxide, and the like. A preferred catalyst in connection with this invention is DBU and tetramethylguanidine. The amount of catalyst used in the Michael addition reaction is preferably between 0.05% by weight and 2% by weight more preferably between 0.1% by weight and 1.0% by weight, relative to solids.

Below are examples of molecules synthesized via Michael addition of amine functional tri-methoxysilane to di-functional (di-(meth)acrylate) monomers, particularly including Sartomer SR 833s. It should be noted that the Michael addition may occur with either (meth)acrylate group of the SR 833s, though only one of the addition products is pictured. Due to the large excess of SR 833s used, Michael addition for any given molecule is likely on only one of the (meth)acrylate groups:

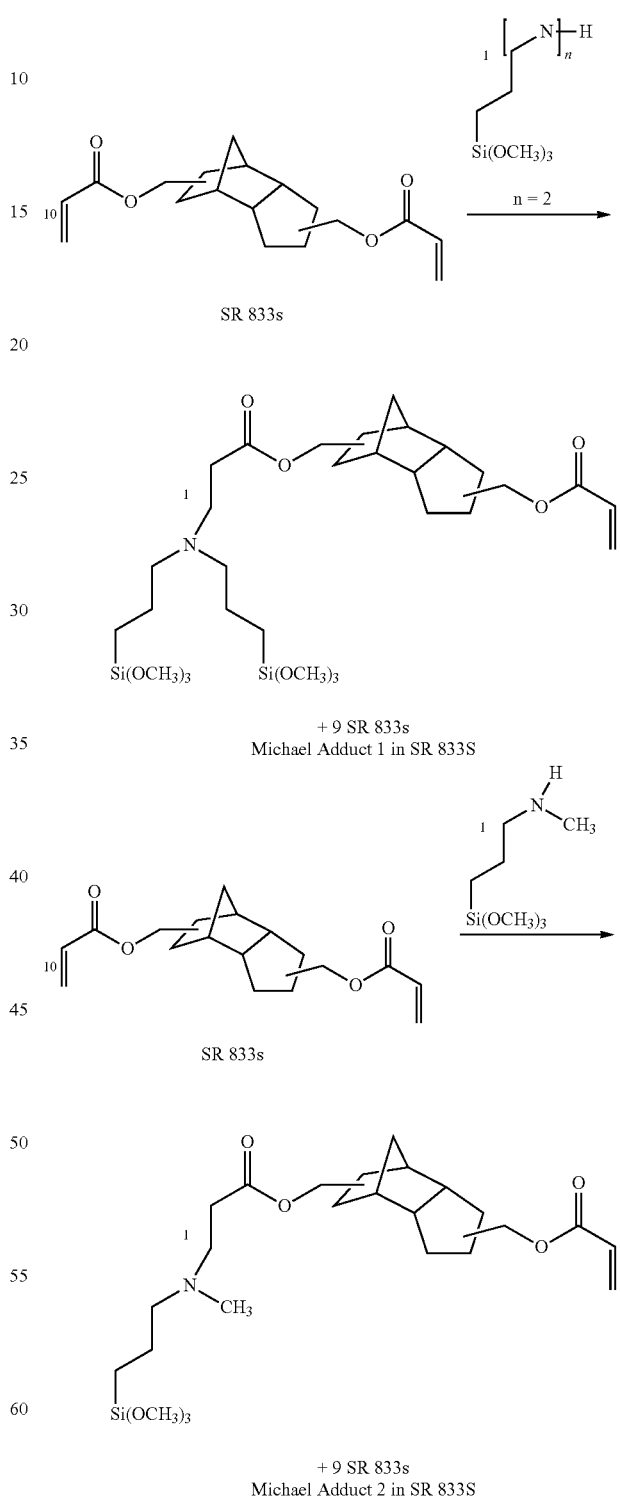

Other suitable Michael adducts may include the following Michael adducts of (meth)acrylated isocyanurates:

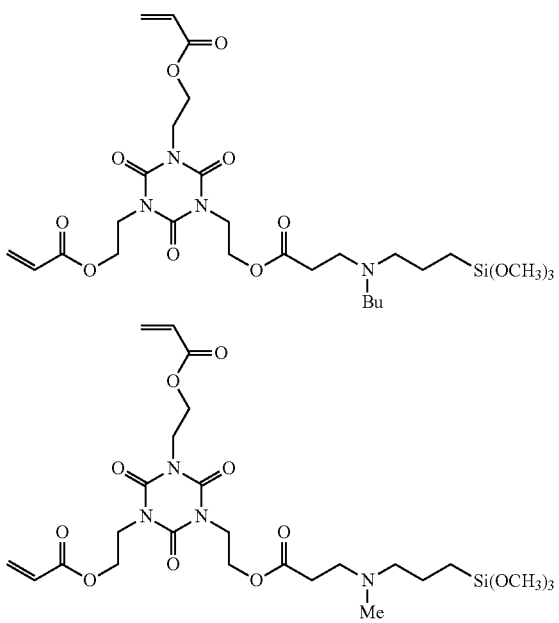

When the multi(meth)acryloyl compound contains both (meth)acrylate and (meth)acrylate functionality, the aminosilane will usually react selectively with the (meth)acrylate functionality, leaving the (meth)acrylate double bond intact. In this case the aminosilane(s) and the multi(meth)acryloyl compound(s) may be reacted in equal stoichiometric amounts to form pure Michael adducts with silane and meth(meth)acrylate functionality. Exemplary Michael adducts with silane and (meth)acrylate functionality include:

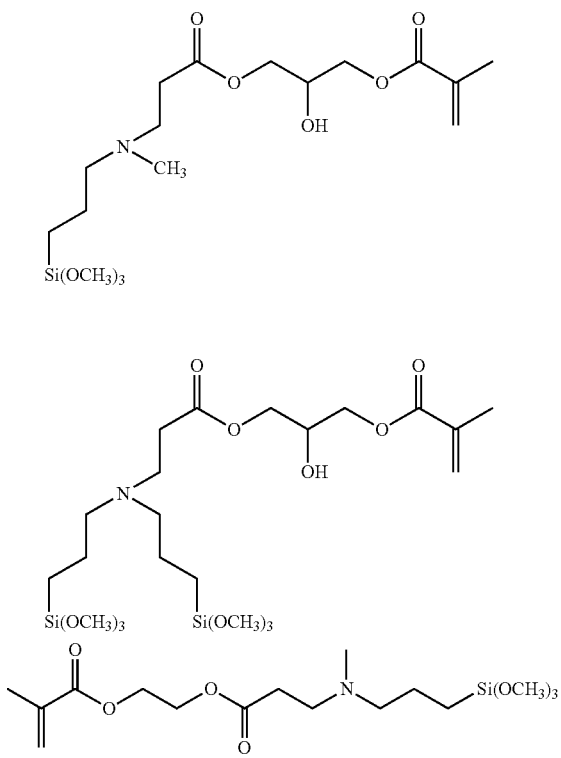

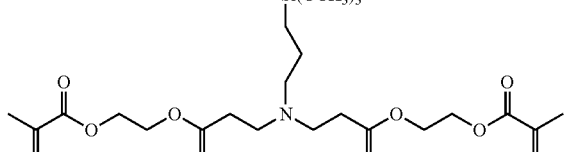

Vapor Coating Compositions

The vapor coating compositions may be prepared via Michael addition of amine functional tri-alkoxy silanes to di-functional (di-(meth)acrylate) monomers, e.g. SR 833s. Preferably, the Michael addition is carried out under conditions in which the silane (e.g., aminosilane) is present in the reaction mixture at extreme dilution. Preferably, the silane is present at no more than 15% by weight (% wt.) of the reaction mixture; more preferably no more than 14%, 13%, 12%, 11%, and even more preferably 10%, 9%, 8%, 7%, 6%, 5%, 4%, 3%, 2% or even 1% wt. of the reaction mixture.

Without wishing to be bound by any particular theory, the inventors presently believe that it is by the extreme dilution of the silane that a monoadduct is obtained. In other words, the preferred Michael adduct includes both at least one tri-alkoxy silyl group, and at least one unsaturated double bond (vinyl group) in a (meth)acryl group. The resulting Michael adduct can then be polymerized through the unsaturated vinyl group by exposure to electron beam or UV radiation. The tri-alkoxy silyl group in the Michael adduct, when placed next to an inorganic surface containing hydroxyl groups (e.g. the oxide layer 16), readily reacts to form a stable chemical bond linking the (co)polymer to the oxide surface.

In cases wherein the multi(meth)acryloyl compound contains both (meth)acrylate and (meth)acrylate functionality, the aminosilane(s) and the multi(meth)acryloyl compound(s) may be reacted in equal stoichiometric amounts to form Michael adducts with silane and (meth)acrylate functionality. The Michael adduct may then be added to a second acryol compound for use in vapor coating. Preferably, the Michael adduct silane (meth)acrylate is present at no more than 20% by weight (% wt.) of the vapor coated mixture; more preferably no more than 19%, 18%, 17%, 16%, 15%, 14%, 13%, 12%, 11%, and even more preferably 10%, 9%, 8%, 7%, 6%, 5%, 4%, 3%, 2% or even 1% wt. of the vapor deposited mixture.

The molecular weights of the Michael adduct are in the range where sufficient vapor pressure at vacuum process conditions is effective to carry out evaporation and then subsequent condensation to a thin liquid film. The molecular weights are preferably less than about 2,000 Da, more preferably less than 1,000 Da, even more preferably less than 500 Da. For this reason, Michael adducts which are oligomerized or polymerized via condensation through their hydrolyzable silane groups either alone or in conjunction with other metal alkoxides such as $Si(OCH_2CH_3)_4$ are undesirable due to their high molecular weight and low vapor pressure at vacuum process conditions.

Suitable vapor coating compositions include, for example:

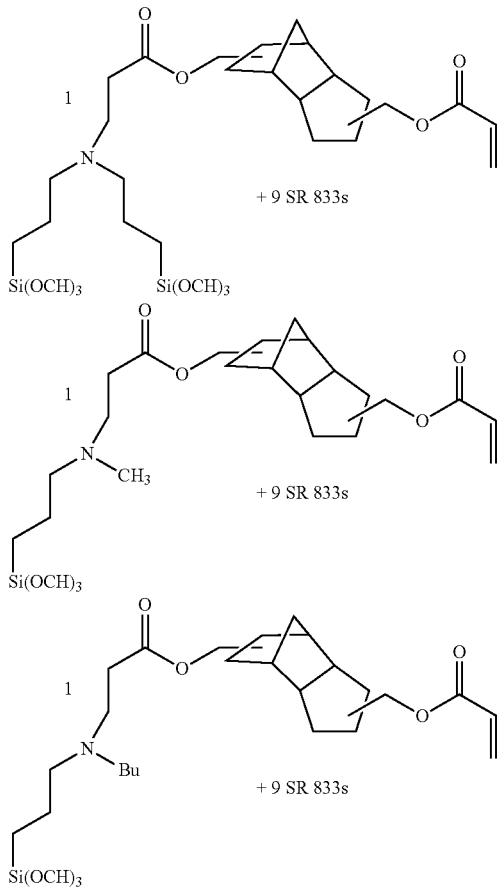

As noted above, another advantageous feature of the presently disclosed process is the ability to form hydroxyl silanol (Si—OH) groups on a freshly sputter deposited $SiO_2$ layer. The amount of water vapor present in a multi-process vacuum chamber can be controlled sufficiently to promote the formation of Si—OH groups in high enough surface concentration to provide increased bonding sites. With residual gas monitoring and the use of water vapor sources, the amount of water vapor in a vacuum chamber can be controlled to ensure adequate generation of Si—OH groups.

In exemplary embodiments, this process improves the overall adhesion and adhesion retention of vapor deposited multilayer barrier coatings after exposure to moisture by the addition of a Michael adduct (meth)acryl-silane coupling agent. The Michael adduct (meth)acryl-silane coupling agent is added to a pre-(co)polymer formulation and co-evaporated in a vapor coating process where the Michael adduct (meth)acryl-silane pre-(co)polymer formulation condenses onto a moving web substrate that has just been sputter coated with an oxide of silicon and aluminum. The condensed liquid is then polymerized in the same process by electron beam radiation. With the addition of Michael adduct (meth)acryl-silane the peel strength of the coating is greatly improved and peel strength adhesion is retained after exposure to high heat and humidity conditions. Additionally, the addition of Michael adduct (meth)acryl-silane removes the need for a tie layer, which greatly simplifies the coating process and barrier coating stack construction by removing the tie layer altogether. The resulting barrier coatings retain high barrier properties and optical transmission performance.

Process for Making Barrier Layers and Films

In another aspect, the disclosure describes a process for making a barrier layer or composite film, comprising:
(a) applying a base (co)polymer layer to a major surface of a substrate;
(b) applying an oxide layer on the base (co)polymer layer; and
(c) depositing on the oxide layer a first (meth)acryloyl compound and a (meth)acryl-silane compound derived from a Michael reaction between a second (meth)acryloyl compound and an aminosilane, and reacting the (meth)acryl-silane compound with the first (meth)acryloyl compound to form a protective (co)polymer layer on the oxide layer.

In one exemplary presently preferred embodiment, the disclosure describes a process for making a barrier film, the process including:
(a) vapor depositing and curing a base (co)polymer layer onto a major surface of a substrate;
(b) vapor depositing an oxide layer on the base (co)polymer layer; and
(c) vapor depositing on the oxide layer a first (meth)acryloyl compound and a (meth)acryl-silane compound derived from a Michael reaction between a second (meth)acryloyl compound and an aminosilane, and reacting the (meth)acryl-silane compound with the first (meth)acryloyl compound to form a protective (co)polymer layer on the oxide layer.

In some presently preferred embodiments, step (a) comprises:
(i) evaporating a base (co)polymer precursor;
(ii) condensing the evaporated base (co)polymer precursor onto the substrate; and
(iii) curing the evaporated base (co)polymer precursor to form the base (co)polymer layer.

In other exemplary embodiments, step (b) comprises depositing an oxide onto the base (co)polymer layer to form the oxide layer, wherein depositing is achieved using sputter deposition, reactive sputtering, plasma enhanced chemical vapor deposition, or a combination thereof.

In one presently preferred embodiment step (b) comprises applying a layer of an inorganic silicon aluminum oxide to the base (co)polymer layer.

In further exemplary embodiments, the process further comprises sequentially repeating steps (b) and (c) to form a plurality of alternating layers (i.e. dyads) of the protective (co)polymer layer and the oxide layer on the base (co)polymer layer.

In certain exemplary embodiments, 17, step (c) further comprises at least one of co-evaporating the (meth)acryl-silane compound with the (meth)acryloyl compound from a liquid mixture, or sequentially evaporating the (meth)acryl-silane compound and the (meth)acryloyl compound from separate liquid sources. Optionally, and preferably when co-evaporating the (meth)acryl-silane compound with the (meth)acryloyl compound from a liquid mixture, the liquid mixture comprises no more than about 10 wt. % of the (meth)acryl-silane. In such co-evaporating embodiments, step (c) preferably further comprises at least one of co-condensing the (meth)acryl-silane compound with the (meth)acryloyl compound onto the oxide layer, or sequentially condensing the (meth)acryl-silane compound and the (meth)acryloyl compound on the oxide layer.

(co)polymer(co)polymer(co)polymer(co)polymerFIG. 2 is a diagram of a system 22, illustrating a process for making barrier film 10. System 22 is contained within an inert environment and includes a chilled drum 24 for receiving and moving the substrate 12 (FIG. 1), as represented by a film 26, thereby providing a moving web on which to form the barrier layers. Preferably, an optional nitrogen plasma treatment unit 40 may be used to plasma treat or prime film 26 in order to improve adhesion of the base (co)polymer layer 14 (FIG. 1) to substrate 12 (FIG. 1). An evaporator 28 applies a base (co)polymer precursor, which is cured by curing unit 30 to form base (co)polymer layer 14 (FIG. 1) as drum 24 advances the film 26 in a direction shown by arrow 25. An oxide sputter unit 32 applies an oxide to form layer 16 (FIG. 1) as drum 24 advances film 26.

For additional alternating oxide layers 16 and protective (co)polymer layers 18, drum 24 can rotate in a reverse direction opposite arrow 25 and then advance film 26 again to apply the additional alternating base (co)polymer and oxide layers, and that sub-process can be repeated for as many alternating layers as desired or needed. Once the base (co)polymer and oxide are complete, drum 24 further advances the film, and evaporator 36 deposits on oxide layer 16 a mixture of the (meth)acryl-silane compound derived from a Michael reaction between an aminosilane and an acryloyl group, and the (meth)acryloyl compound, which is reacted or cured to form protective (co)polymer layer 18 (FIG. 1). In certain presently preferred embodiments, reacting the (meth)acryloyl compound with the (meth)acryl-silane compound to form a protective (co)polymer layer 18 on the oxide layer 16 occurs at least in part on the oxide layer 16.

Optional evaporator 34 may be used additionally to provide other co-reactants or co-monomers (e.g. additional (meth)acryloyl compounds) which may be useful in forming the protective (co)polymer layer 18 (FIG. 1). For additional alternating oxide layers 16 and protective (co)polymer layers 18, drum 24 can rotate in a reverse direction opposite arrow 25 and then advance film 26 again to apply the additional alternating oxide layers 16 and protective (co)polymer layers 18, and that sub-process can be repeated for as many alternating layers or dyads as desired or needed.

The oxide layer 16 can be formed using techniques employed in the film metalizing art such as sputtering (e.g., cathode or planar magnetron sputtering), evaporation (e.g., resistive or electron beam evaporation), chemical vapor deposition, plating and the like. In one aspect, the oxide layer 16 is formed using sputtering, e.g., reactive sputtering. Enhanced barrier properties have been observed when the oxide layer is formed by a high energy deposition technique such as sputtering compared to lower energy techniques such as conventional chemical vapor deposition processes. Without being bound by theory, it is believed that the enhanced properties are due to the condensing species arriving at the substrate with greater kinetic energy as occurs in sputtering, leading to a lower void fraction as a result of compaction.

In some exemplary embodiments, the sputter deposition process can use dual targets powered by an alternating current (AC) power supply in the presence of a gaseous atmosphere having inert and reactive gasses, for example argon and oxygen, respectively. The AC power supply alternates the polarity to each of the dual targets such that for half of the AC cycle one target is the cathode and the other target is the anode. On the next cycle the polarity switches between the dual targets. This switching occurs at a set frequency, for example about 40kHz, although other frequencies can be used. Oxygen that is introduced into the process forms oxide layers on both the substrate receiving the inorganic composition, and also on the surface of the target. The dielectric oxides can become charged during sputtering, thereby disrupting the sputter deposition process. Polarity switching can neutralize the surface material being sputtered from the targets, and can provide uniformity and better control of the deposited material.

In further exemplary embodiments, each of the targets used for dual AC sputtering can include a single metal or nonmetal element, or a mixture of metal and/or nonmetal elements. A first portion of the oxide layer closest to the moving substrate is deposited using the first set of sputtering targets. The substrate then moves proximate the second set of sputtering targets and a second portion of the oxide layer is deposited on top of the first portion using the second set of sputtering targets. The composition of the oxide layer changes in the thickness direction through the layer.

In additional exemplary embodiments, the sputter deposition process can use targets powered by direct current (DC) power supplies in the presence of a gaseous atmosphere having inert and reactive gasses, for example argon and oxygen, respectively. The DC power supplies supply power (e.g. pulsed power) to each cathode target independent of the other power supplies. In this aspect, each individual cathode target and the corresponding material can be sputtered at differing levels of power, providing additional control of composition through the layer thickness. The pulsing aspect of the DC power supplies is similar to the frequency aspect in AC sputtering, allowing control of high rate sputtering in the presence of reactive gas species such as oxygen. Pulsing DC power supplies allow control of polarity switching, can neutralize the surface material being sputtered from the targets, and can provide uniformity and better control of the deposited material.

In one particular exemplary embodiment, improved control during sputtering can be achieved by using a mixture, or atomic composition, of elements in each target, for example a target may include a mixture of aluminum and silicon. In another embodiment, the relative proportions of the elements in each of the targets can be different, to readily provide for a varying atomic ratio throughout the oxide layer. In one embodiment, for example, a first set of dual AC sputtering targets may include a 90/10 mixture of silicon and aluminum, and a second set of dual AC sputtering targets may include a 75/25 mixture of aluminum and silicon. In this embodiment, a first portion of the oxide layer can be deposited with the 90%Si/10%Al target, and a second portion can be deposited with the 75%Al/25%Si target. The resulting oxide layer has a gradient composition that changes from about 90% Si to about 25% Si (and conversely from about 10% Al to about 75% Al) through the thickness of the oxide layer.

In typical dual AC sputtering, homogeneous oxide layers are formed, and barrier performance from these homogeneous oxide layers suffer due to defects in the layer at the micro and nano-scale. One cause of these small scale defects is inherently due to the way the oxide grows into grain boundary structures, which then propagate through the thickness of the film. Without being bound by theory, it is believed several effects contribute to the improved barrier properties of the gradient composition barriers described herein. One effect can be that greater densification of the mixed oxides occurs in the gradient region, and any paths that water vapor could take through the oxide are blocked by this densification. Another effect can be that by varying the composition of the oxide materials, grain boundary formation can be disrupted resulting in a microstructure of the film that also varies through the thickness of the oxide layer.

Another effect can be that the concentration of one oxide gradually decreases as the other oxide concentration increases through the thickness, reducing the probability of forming small-scale defect sites. The reduction of defect sites can result in a coating having reduced transmission rates of water permeation.

The (meth)acryl-silane compound derived from a Michael reaction between an aminosilane and an acryloyl group, and the (meth)acryloyl compound are preferably co-deposited on oxide layer 16 (FIG. 1) and, as drum 24 advances the film, are cured together by curing unit 38 to form protective (co)polymer layer 18. Co-depositing the (meth)acryl-silane and the (meth)acryloyl compound can involve sequentially evaporating the (meth)acryloyl compound and the (meth)acryl-silane compound from separate sources, or co-evaporating a mixture of the (meth)acryloyl compound and the (meth)acryl-silane compound.

The films can be subjected to post-treatments such as heat treatment, ultraviolet (UV) or vacuum UV (VUV) treatment, or plasma treatment. Heat treatment can be conducted by passing the film through an oven or directly heating the film in the coating apparatus, e.g., using infrared heaters or heating directly on a drum. Heat treatment may for example be performed at temperatures from about 30° C. to about 200° C., about 35° C. to about 150° C., or about 40° C. to about 70° C.

Other functional layers or coatings that can be added to the inorganic or hybrid film include an optional layer or layers to make the film more rigid. The uppermost layer of the film is optionally a suitable protective layer, such as optional inorganic layer 20. If desired, the protective layer can be applied using conventional coating methods such as roll coating (e.g., gravure roll coating) or spray coating (e.g., electrostatic spray coating), then crosslinked using, for example, UV radiation. The protective layer can also be formed by flash evaporation, vapor deposition and crosslinking of a monomer as described above. Volatilizable (meth)acrylate monomers are suitable for use in such a protective layer. In a specific embodiment, volatilizable (meth)acrylate monomers are employed.

Methods of Using Barrier Films

In a further aspect, the disclosure describes methods of using a barrier film made as described above in an article selected from a photovoltaic device, a display device, a solid state lighting device, and combinations thereof. Presently preferred articles incorporating such barrier films include flexible thin film (e.g. copper indium gallium diselenide, CIGS) and organic photovoltaic solar cells, and organic light emitting diodes (OLED) used in displays and solid state lighting. Currently these applications are generally limited to non-flexible glass substrates used as vapor barriers.

Exemplary embodiments of the present disclosure provide barrier films which exhibit improved moisture resistance when used in moisture barrier applications. In some exemplary embodiments, the barrier film can be deposited directly on a substrate that includes a moisture sensitive device, a process often referred to as direct encapsulation. The moisture sensitive device can be, for example, an organic, inorganic, or hybrid organic/inorganic semiconductor device including, for example, a photovoltaic device such as a CIGS; a display device such as an OLED, electrochromic, or an electrophoretic display; an OLED or other electroluminescent solid state lighting device, or others. Flexible electronic devices can be encapsulated directly with the gradient composition oxide layer. For example, the devices can be attached to a flexible carrier substrate, and a mask can be deposited to protect electrical connections from the oxide layer deposition. A base (co)polymer layer and the oxide layer can be deposited as described above, and the mask can then be removed, exposing the electrical connections.

Exemplary embodiments of the disclosed methods can enable the formation of barrier films that exhibit superior mechanical properties such as elasticity and flexibility yet still have low oxygen or water vapor transmission rates. The films have at least one inorganic or hybrid organic/oxide layer or can have additional inorganic or hybrid organic/oxide layers. In one embodiment, the disclosed films can have inorganic or hybrid layers alternating with organic compound, e.g., (co)polymer layers. In another embodiment, the films can have a film that includes an inorganic or hybrid material and an organic compound. Substrates having a barrier film formed using the disclosed method can have an oxygen transmission rate (OTR) less than about 1 $cc/m^2$-day, less than about 0.5 $cc/m^2$-day, or less than about 0.1 $cc/m^2$-day. Substrates having a barrier film formed using the disclosed method can have an water vapor transmission rate (WVTR) less than about 10 $cc/m^2$-day, less than about 5 $cc/m^2$-day, or less than about 1 $cc/m^2$-day.

Exemplary embodiments of barrier films according to the present disclosure are preferably transmissive to both visible and infrared light. The term "transmissive to visible and infrared light" as used herein can mean having an average transmission over the visible and infrared portion of the spectrum of at least about 75% (in some embodiments at least about 80, 85, 90, 92, 95, 97, or 98%) measured along the normal axis. In some embodiments, the visible and infrared light-transmissive assembly has an average transmission over a range of 400 nm to 1400 nm of at least about 75% (in some embodiments at least about 80, 85, 90, 92, 95, 97, or 98%). Visible and infrared light-transmissive assemblies are those that do not interfere with absorption of visible and infrared light, for example, by photovoltaic cells.

In some exemplary embodiments, the visible and infrared light-transmissive assembly has an average transmission over a range wavelengths of light that are useful to a photovoltaic cell of at least about 75% (in some embodiments at least about 80, 85, 90, 92, 95, 97, or 98%). The first and second polymeric film substrates, pressure sensitive adhesive layer, and barrier film can be selected based on refractive index and thickness to enhance transmission to visible and infrared light. Suitable methods for selecting the refractive index and/or thickness to enhance transmission to visible and/or infrared light are described in copending PCT International Publication Nos. WO 2012/003416 and WO 2012/003417.

Exemplary barrier films according to the present disclosure are typically flexible. The term "flexible" as used herein refers to being capable of being formed into a roll. In some embodiments, the term "flexible" refers to being capable of being bent around a roll core with a radius of curvature of up to 7.6 centimeters (cm) (3 inches), in some embodiments up to 6.4 cm (2.5 inches), 5 cm (2 inches), 3.8 cm (1.5 inch), or 2.5 cm (1 inch). In some embodiments, the flexible assembly can be bent around a radius of curvature of at least 0.635 cm (¼ inch), 1.3 cm (½ inch) or 1.9 cm (¾ inch).

Exemplary barrier films according to the present disclosure generally do not exhibit delamination or curl that can arise from thermal stresses or shrinkage in a multilayer structure. Herein, curl is measured using a curl gauge described in "Measurement of Web Curl" by Ronald P. Swanson presented in the 2006 AWEB conference proceedings (Association of Industrial Metallizers, Coaters and Laminators, Applied Web Handling Conference Proceedings, 2006). According to this method curl can be measured to the resolution of 0.25 m$^{-i}$ curvature. In some embodiments, barrier films according to the present disclosure exhibit curls of up to 7, 6, 5, 4, or 3 m$^{-1}$. From solid mechanics, the curvature of a beam is known to be proportional to the bending moment applied to it. The magnitude of bending stress is in turn is known to be proportional to the bending moment. From these relations the curl of a sample can be used to compare the residual stress in relative terms. Barrier films also typically exhibit high peel adhesion to EVA, and other common encapsulants for photovoltaics, cured on a substrate. The properties of the barrier films disclosed herein typically are maintained even after high temperature and humidity aging.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

All parts, percentages, and ratios in the examples are by weight, unless noted otherwise. Solvents and other reagents used were obtained from Sigma-Aldrich Chemical Company; Milwaukee, Wis. unless specified differently.

Materials

Tricyclodecane dimethanol di(meth)acrylate was obtained from Sartomer, Exton, Pa. as Sartomer SR 833s and is believed to have the structure indicated below:

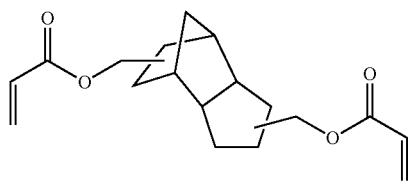

Acetyl chloride, triethylamine, dibutylamine, and 3-(acryloxy)-2-hydroxy-propyl(meth)acrylate were obtained from Sigma-Aldrich, Milwaukee, Wis., and the latter has as its major component:

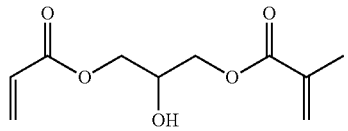

Amino-bis(propyl-3-trimethoxysilane), HN[(CH$_2$)$_3$Si(OCH$_3$)$_3$]$_2$ and N-butyl-aminopropyltrimethoxysilane, HN(CH$_2$CH$_2$CH$_2$CH$_3$)(CH$_2$)$_3$Si(OCH$_3$)$_3$ were obtained from Evonik Industries, Parsippany, N.J. as Dynasylan 1124, and Dynasylan 1189, respectively.

N-methyl-aminopropyltrimethoxysilane, HN(CH$_3$)(CH$_2$)$_3$ Si(OCH$_3$)$_3$, was obtained from SynQuest Labs, Alachua, Fla.

N-n-butyl-aza-2,2-dimethoxysilacyclopentane was obtained from Gelest, Inc., Morrisville, Pa. under the name "Cyclic AZA Silane 1932.4."

Preparative Example of Michael Adducts

Preparative Example 1

Synthesis of Michael Adduct 1 in SR833s

To a 100 mL 3 necked roundbottom equipped with overhead stirrer was charged 75 g (0.2467 mol) Sartomer SR 833s, and 4.76 g (0.02467 mol) N-methyl-aminopropyltrimethoxysilane. The flask was then placed in oil bath at 55° C. and reacted under dry air for 3.5 h to provide Michael Adduct 1 in SR 833s. The calculated molecular weight of the Michael adduct of Preparative Example 1 was 497.

Preparative Example 2

In a manner similar to Preparative Example 1, 75 g (0.2467 mol) Sartomer SR 833s, and 8.43 g (0.02467 mol) amino-bis(propyl-3-trimethoxysilane) were reacted to provide Michael Adduct 2 in SR 833s. The flask was then placed in oil bath at 55° C. and reacted under dry air for 3.5 h, to provide Michael Adduct 1 in SR 833s. The calculated molecular weight of the Michael adduct of Preparative Example 2 was 645.

Preparative Example 3

In a manner similar to Preparative Example 1, 300.0 g (0.9868 mol) Sartomer SR 833s, and 23.23 g (0.09868 mol) N-butyl-aminopropyltrimethoxysilane reacted to provide Michael Adduct 3 in SR 833s. The calculated molecular weight of the Michael adduct of Preparative Example 3 was 539.

Preparative Example 4

In a manner similar to Preparative Example 1, 300.0 g (0.9868 mol) Sartomer SR 833s, and 27.19 g (0.09868 mol) N-cyclohexyl-aminopropyltriethoxysilane reacted to provide Michael Adduct 4 in SR 833s. The calculated molecular weight of the Michael adduct of Preparative Example 4 was 580.

Preparative Example 5

A 100 mL roundbottom equipped with magnetic stirbar was charged with 20.00 g (0.0467 mol) 3-(acryloxy)-2-hydroxy-propyl(meth)acrylate and placed in a 55° C. oil bath. To the reaction was added over 30 min, 18.04 g (0.0467 mol) N-methyl-aminopropyltrimethoxysilane, and heated for 3 h, then characterized by Fourier transform proton NMR. The calculated molecular weight of the Michael adduct of Preparative Example 5 was 408.

Preparative Example 6

Part 1. Preparative Example of
3-(acryloxy)-2-acetoxypropyl(meth)acrylate

A 1L roundbottom flask equipped with an overhead stirrer was charged with 92.89 g (0.420 mol) 3-(acryloxy)-2-hydroxy-propyl(meth)acrylate, 47.74 g (0.513 mol) triethylamine, and 176.06 g t-butyl methyl ether, and placed in an ice bath. Next 35.36 g (0.450 mol) acetyl chloride was added dropwise to the reaction. Over a weekend the solvent evaporated, and 375 g t-butyl methyl ether was added to the reaction which was filtered through a C porosity fritted Buchner funnel. The filtrate was successively washed with 270 g of 2% hydrochloric acid, and 220 g of 5% aqueous sodium carbonate. The reaction was dried over anhydrous magnesium sulfate, filtered and concentrated on a rotary evaporator to yield 37.3 g of an oil (34.7% yield) which was characterized by Fourier transform proton NMR.

Part 2. Preparative Example of the Michael adduct of Preparatory Example 6

In a manner similar to the Preparative Example 4, 26.51 g (0.103 mol) 3-(acryloxy)-2-acetoxypropyl(meth)acrylate was reacted with 20 g of N-methyl-aminopropyl trimethoxysilane to provide the Michael adduct 6. The calculated molecular weight of the Michael adduct of Preparative Example 6 was 450.

Preparative Example 7

A 250 ml roundbottom equipped with stirbar was charged with 50 g (0.16447 mol) SR 833s and 2.125 g (0.016447 mol) dibutylamine, and stirred for 3 h in a 55° C. oil bath, and bottled. The structure for the product distribution of the Michael adduct of Preparative Example 7 is given below:

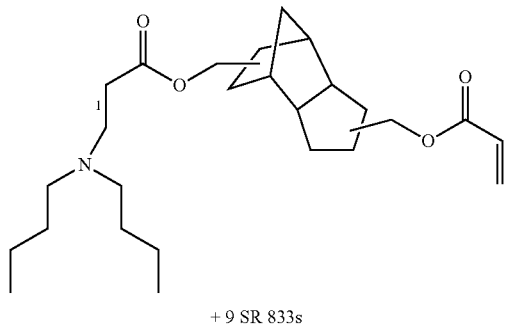

+ 9 SR 833s

The calculated molecular weight of the Michael adduct of Preparative Example 7 was 433.

Simulated Solar Module Construction

Control Examples x and experimental examples x through x below relate to forming simulated solar modules which were subjected to under conditions designed to simulate aging in an outdoor environment and then subjected to a peel adhesion test to determine if the urea (multi) urethane (meth)acrylate silanes of the above examples were effective in improving peel adhesion. Some procedures common to all these Examples are presented first.

Barrier films according to the examples below were laminated to a 0.05 mm thick ethylene tetrafluoroethylene (ETFE) film commercially available as NORTON® ETFE from St. Gobain Performance Plastics of Wayne, N.J., using a 0.05 mm thick pressure sensitive adhesive (PSA) commercially available as 3M OPTICALLY CLEAR ADHESIVE 8172P from 3M Company, of St. Paul, Minn. The laminated barrier sheets formed in each Example below was then placed atop a 0.14 mm thick polytetrafluoroethylene (PTFE) coated aluminum-foil commercially available commercially as 8656K61, from McMaster-Carr, Santa Fe Springs, Calif. with 13 mm wide desiccated edge tape commercially available as SOLARGAIN Edge Tape SET LP01" from Truseal Technologies Inc. of Solon, Ohio) placed around the perimeter of the foil between the barrier sheet and the PTFE. A 0.38 mm thick encapsulant film commercially available as JURASOL from JuraFilms of Downer Grove, Ill. and an additional layer of the laminated barrier sheet were placed on the backside of the foil with the encapsulant between the barrier sheet and the foil. The multi-component constructions were vacuum laminated at 150° C. for 12 min.

Test Methods

Aging Test

The laminated constructions were aged up to 1000 hours an environmental chamber set to conditions of 85° C. and 85% relative humidity.

T-Peel Adhesion Test

Unaged and aged barrier sheets were cut away from the PTFE surface and divided into 1.0 in wide strips for adhesion testing using the ASTM D1876-08 T-peel test method. The samples were peeled by a peel tester (commercially available under the trade designation "INISIGHT 2 SL" with Testworks 4 software from MTS, Eden Prairie, Minn.) with a 10 in/min (25.4 cm/min) peel rate. The reported adhesion value in Newtons per centimeter (N/cm) is the average of four peel measurements from 1.27 cm o 15,1 cm. The barrier sheets were measured for t-peel adhesion after 250 hours of 85° C. and 85% relative humidity and again after 500 and/or 1000 hours of exposure.

Barrier Stack Deposition Examples

Comparative Example 1

A polyethylene terephthalate (PET) substrate film was covered with a stack of an (meth)acrylate smoothing layer, an inorganic silicon aluminum oxide (SiAlOx) barrier and an (meth)acrylate protective layer. The individual layers were formed as follows:

(Layer 1—(meth)acrylate smoothing layer)

A 280 meter long roll of 0.127 mm thick x 366 mm wide PET film (commercially available from Dupont, Wilmington, Del., under the trade name "XST 6642") was loaded into a roll-to-roll vacuum processing chamber. The chamber was pumped down to a pressure of $1 \times 10^{-5}$ Torr. The web speed was maintained at 4.9 meter/min while maintaining the backside of the film in contact with a coating drum chilled to −10° C. With the film in contact with the drum, the film surface was treated with a nitrogen plasma at 0.02 kW of plasma power. The film surface was then coated with tricyclodecane dimethanol di(meth)acrylate (trade name "SR-833S", commercially available from Sartomer USA, LLC, Exton, Pa.). The di(meth)acrylate was degassed under vacuum to a pressure of 20 mTorr prior to coating, loaded into a syringe pump, and pumped at a flow rate of 1.33 mL/min through an ultrasonic atomizer operated at a frequency of 60 kHz into a heated vaporization chamber maintained at 260° C. The resulting monomer vapor stream condensed onto the film surface and was electron beam crosslinked using a multi-filament electron-beam cure gun operated at 7.0 kV and 4 mA to form a 720 nm (meth) acrylate layer.

(Layer 2—Inorganic Layer)

Immediately after the (meth)acrylate deposition and with the film still in contact with the drum, a SiAlOx layer was sputter-deposited atop the desired length (23 m) of the (meth)acrylate-coated web surface. Two alternating current (AC) power supplies were used to control two pairs of cathodes; with each cathode housing two 90% Si/10% Al targets (targets commercially available from Materion). During sputter deposition, the voltage signal from each power supply was used as an input for a proportional-integraldifferential control loop to maintain a predetermined oxygen flow to each cathode. The AC power supplies sputtered the 90% Si/10% Al targets using 5000 watts of power, with a total gas mixture containing 850 sccm argon and 94 sccm oxygen at a sputter pressure of 3.2 millitorr. This provided a 24 nm thick SiAlOx layer deposited atop the Layer 1 (meth)acrylate.

(Layer 3—(Meth)Acrylate Compound Protective Layer)

Immediately after the SiAlOx layer deposition and with the film still in contact with the drum, a second (meth) acrylate compound (the same (meth)acrylate compound as in layer 1) was coated and crosslinked on the same 23 meter web length using the same general conditions as for Layer 1, but with the following exceptions. Electron beam cross-linking was carried out using a multi-filament electron-beam cure gun operated at 7 kV and 5 mA. This provided a 720 nm thick (meth)acrylate layer atop Layer 2.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% relative humidity (RH) and the result was below the 0.005 g/m2/day lower detection limit rate of the MOCON PERMATRAN-W® Model 700 WVTR testing system (commercially available from MOCON, Inc, Minneapolis, Minn.).

As shown in Table 1 the initial, 250, and 1000 hour T-Peel adhesion values of this comparative film sample were 0.3 N/cm, 0.1N/cm, and 0.1 N/cm respectively.

Comparative Example 2

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction but not containing silane functionality. The individual layers were formed as in Comparative Example 1 except in Layer 3 a mixture of 71% by weight of Preparative Example 7 and 29% by weight of the "SR-833S" di(meth)acrylate (this ratio corresponds to 3 parts of starting secondary amine coupling agent to 100 parts of SR833S) were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the comparative film had an initial T-Peel adhesion value of 0.24 N/cm and a value of 0.13 N/cm after 250 hours of the 85/85 accelerated aging.

Comparative Example 3

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a cyclic amino silane not derived from a Michael reaction. The individual layers were formed as in Comparative Example 1 except in Layer 3 a mixture of 3% by weight of N-n-butyl-AZA-2,2-dimethoxysilacyclo-pentane (commercially available from Gelest, Morrisville, Pa., under the product code 1932.4) and 97% by weight of the "SR-833 S" di(meth)acrylate were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system.

As shown in Table 1 the initial, 250, 500, and 1000 hour T-Peel adhesion values of this comparative film sample were 6.1 N/cm, 10.1N/cm, 8.9 N/cm, and 0.1 N/cm, respectively.

Example 1

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction and containing silane functionality. The individual layers were formed as in Comparative Example 1 except in Layer 3 a mixture of 47% by weight of Preparative Example 1 and 53% by weight of the "SR-833S" di(meth)acrylate (this ratio corresponds to 3 parts of starting secondary amine coupling agent of Preparative Example 1 to 100 parts of SR833S) were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the initial, 250, and 1000 hour T-Peel adhesion values of this invention film sample were 7.9 N/cm, 9.3 N/cm, and 0.4 N/cm, respectively.

Example 2

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction and containing silane functionality. The individual layers were formed as in Comparative Example 1 except in Layer 3 a mixture of 27% by weight of Preparative Example 2 and 73% by weight of the "SR-833S" di(meth)acrylate (this ratio corresponds to 3 parts of starting secondary amine coupling agent of Preparative Example 2 to 100 parts of SR833S) were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the initial, 250, and 1000 hour T-Peel adhesion values of this invention film sample were 7.8 N/cm, 10.2 N/cm, and 2.5 N/cm, respectively.

Example 3

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction and containing silane functionality. The individual layers were formed as in Comparative Example 1 except in Layer 3 a mixture of 39% by weight of Preparative Example 3 and 61% by weight of the "SR-833S" di(meth)acrylate (this ratio corresponds to 3 parts of starting secondary amine coupling agent of Preparative Example 3 to 100 parts of SR833S) were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the initial, 250, and 500 hour T-Peel adhesion values of this invention film sample were 7.5 N/cm, 10.4 N/cm, and 2.1 N/cm, respectively.

Example 4

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction and containing silane functionality. The individual layers were formed as in Comparative Example 1 except in Layer 3 a mixture of 33% by weight of Preparative Example 4 and 67% by weight of the "SR-833S" di(meth)acrylate (this ratio corresponds to 3 parts of starting secondary amine coupling agent of Preparative Example 4 to 100 parts of SR833S) were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the initial, 250, and 1000 hour T-Peel adhesion values of this invention film sample were 0.3 N/cm, 0.1 N/cm, and 0.1 N/cm, respectively.

Example 5

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction and containing silane functionality. The individual layers were formed as in Comparative Example 1 except in Layer 3 a mixture of 7.5 parts by weight of Preparative Example 5 and 100 parts by weight of the "SR-833S" di(meth)acrylate were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the initial, 250, 500, and 1000 hour T-Peel adhesion values of this invention film sample were 7.0 N/cm, 6.7 N/cm, 0.3 N/cm, and 0.4 N/cm, respectively.

Example 6

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction and containing silane functionality. The individual layers were formed as in Comparative Example 1 except in Layer 3 a mixture of 3 parts by weight of Preparative Example 5 and 100 parts by weight of the "SR-833S" di(meth)acrylate were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the initial, 250, 500, and 1000 hour T-Peel adhesion values of this invention film sample were 7.7 N/cm, 10.1 N/cm, 4.9 N/cm, and 2.1 N/cm, respectively.

Example 7

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction and containing silane functionality. The individual layers were formed as in Comparative Example 1 except in Layer 3 a mixture of 7.5 parts by weight of Preparative Example 6 and 100 parts by weight of the "SR-833S" di(meth)acrylate were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the initial, 250, 500, and 1000 hour T-Peel adhesion values of this invention film sample were 7.7 N/cm, 9.6 N/cm, 2.8 N/cm, and 0.4 N/cm, respectively.

Example 8

A polyethylene terephthalate (PET) substrate film was covered with a stack of an (meth)acrylate smoothing layer, an inorganic silicon aluminum oxide (SiAlOx) barrier and an (meth)acrylate protective layer containing an (meth) acrylate and a comparative compound molecule derived from a Michael reaction and containing silane functionality. The individual layers were formed as in Comparative Example 1 except in Layer 3 a mixture of 3 parts by weight of Preparative Example 6 and 100 parts by weight of the "SR-833S" di(meth)acrylate were co-evaporated, condensed and electron beam cross-linked.

The resulting three layer stack on the polymeric substrate exhibited an average spectral transmission $T_{vis}$=87% (determined by averaging the percent transmission T between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc).

As shown in Table 1 the initial, 250, 500, and 1000 hour T-Peel adhesion values of this invention film sample were 7.9 N/cm, 9.8 N/cm, 9.6 N/cm, and 3.4 N/cm, respectively.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was

TABLE 1

| Example | T-peel Initial (N/cm) | T-peel after 250 hrs of 85° C./85% RH Exposure (N/cm) | T-peel after 500 hrs of 85° C./85% RH Exposure (N/cm) | T-peel after 1000 hrs of 85° C./85% RH Exposure (N/cm) |
|---|---|---|---|---|
| Comparative 1 | 0.3 | 0.1 | No sample available for testing | 0.1 |
| Comparative 2 Using Preparative Example 7 | 0.2 | 0.1 | No sample available for testing | No sample available for testing |
| Comparative 3 Using Cyclic AZA Silane | 6.1 | 10.1 | 8.9 | 0.4 |
| Invention Example 1 Using Preparative Example 1 | 7.9 | 9.3 | No sample available for testing | 0.4 |
| Invention Example 2 Using Preparative Example 2 | 7.8 | 10.2 | No sample available for testing | 2.5 |
| Invention Example 3 Using Preparative Example 3 | 7.5 | 10.4 | 2.1 | No sample available for testing |
| Invention Example 4 Using Preparative Example 4 | 0.3 | 0.1 | No sample available for testing | 0.1 |
| Invention Example 5 Using Preparative Example 5 | 7.0 | 6.7 | 0.3 | 0.4 |
| Invention Example 6 Using Preparative Example 5 | 7.7 | 10.1 | 4.9 | 2.1 |
| Invention Example 7 Using Preparative Example 6 | 7.7 | 9.6 | 2.8 | 0.4 |
| Invention Example 8 Using Preparative Example 6 | 7.9 | 9.8 | 9.6 | 3.4 |

The invention claimed is:

1. A barrier film, comprising:
   a substrate;
   a base (co)polymer layer on a major surface of the substrate;
   an oxide layer on the base (co)polymer layer; and
   a protective (co)polymer layer on the oxide layer,
   wherein the protective (co)polymer layer comprises a (co)polymer consisting of a reaction product of only:
   tricyclodecanedimethanol di(meth)acrylate with a (meth)acryl-silane compound having the formula:

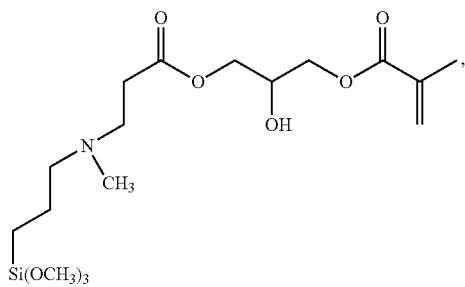

wherein the (meth)acryl-silane compound is derived from a Michael reaction between 3-(acryloxy)-2-hydroxyl-propyl(meth)acrylate and N-methyl-aminopropyl trimethoxysilane.

2. The barrier film of claim 1, further comprising a plurality of alternating layers of the oxide layer and the protective (co)polymer layer on the base (co)polymer layer.

3. The barrier film of claim 1, wherein the substrate comprises a flexible transparent polymeric film, optionally wherein the substrate comprises polyethylene terephthalate (PET), polyethylene napthalate (PEN), heat stabilized PET, heat stabilized PEN, polyoxymethylene, polyvinylnaphthalene, polyetheretherketone, a fluoropolymer, polycarbonate, polymethyl(meth)acrylate, poly α-methyl styrene, polysulfone, polyphenylene oxide, polyetherimide, polyethersulfone, polyamideimide, polyimide, polyphthalamide, or combinations thereof.

4. The barrier film of claim 1, wherein the base (co) polymer layer comprises a (meth)acrylate smoothing layer.

5. The barrier film of claim 1, wherein the oxide layer comprises oxides, nitrides, carbides or borides of atomic elements from Groups IIA, IIIA, IVA, VA, VIA, VIIA, IB, or IIB, metals of Groups IIIB, IVB, or VB, rare-earth metals, or combinations thereof.

6. The barrier film of claim 1, further comprising an oxide layer applied to the protective (co)polymer layer, optionally wherein the oxide layer comprises silicon aluminum oxide.

7. An article incorporating a barrier film according to claim 1, wherein the article is selected from a photovoltaic device, a display device, a solid state lighting device, and combinations thereof.

8. A process for making a barrier film, comprising:
   (a) applying a base (co)polymer layer to a major surface of a substrate;
   (b) applying an oxide layer on the base (co)polymer layer; and
   (c) depositing on the oxide layer a protective (co)polymer layer comprising a (co)polymer consisting of a reaction product of only tricyclodecanedimethanol di(meth) acrylate with a (meth)acryl-silane compound having the formula:

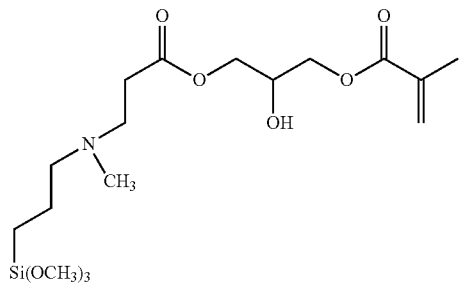

wherein the (meth)acryl-silane compound is derived from a Michael reaction between 3-(acryloxy)-2-hydroxyl-propyl (meth)acrylate and N-methyl-aminopropyl trimethoxysilane.

9. The process of claim 8, wherein step (a) comprises:
   (i) evaporating a base (co)polymer precursor;
   (ii) condensing the evaporated base (co)polymer precursor onto the substrate; and
   (iii) curing the evaporated base (co)polymer precursor to form the base (co)polymer layer.

10. The process of claim 8, wherein step (b) comprises depositing an oxide onto the base (co)polymer layer to form the oxide layer, wherein depositing is achieved using sputter deposition, reactive sputtering, chemical vapor deposition, or a combination thereof.

11. The process of claim 8, wherein step (b) comprises applying a layer of an inorganic silicon aluminum oxide to the base (co)polymer layer.

12. The process of claim 8, further comprising sequentially repeating steps (b) and (c) to form a plurality of alternating layers of the protective (co)polymer layer and the oxide layer on the base (co)polymer layer.

13. The process of claim 8, wherein step (c) further comprises at least one of co-evaporating the tricyclodecanedimethanol di(meth)acrylate with the (meth)acryl-silane compound from a liquid mixture, or sequentially evaporating the tricyclodecanedimethanol di(meth)acrylate and the (meth)acryl-silane compound from separate liquid sources, optionally wherein the liquid mixture comprises no more than about 10 wt. % of the (meth)acryl-silane compound.

14. The process of claim 8, wherein step (c) further comprises at least one of co-condensing the tricyclodecanedimethanol di(meth)acrylate and the (meth)acryl-silane compound onto the oxide layer, or sequentially condensing the tricyclodecanedimethanol di(meth)acrylate and the (meth)acryl-silane compound on the oxide layer.

15. The process of claim 8, wherein reacting the tricyclodecanedimethanol di(meth)acrylate with the (meth)acryl-silane compound to form the protective (co)polymer layer on the oxide layer occurs at least in part on the oxide layer.

16. The process of claim 8, further comprising applying an oxide layer to the top protective (co)polymer layer, optionally wherein the oxide layer comprises at least one of silicon aluminum oxide or indium tin oxide.

* * * * *

UNITED STATES PATENT AND TRADEMARK OFFICE
CERTIFICATE OF CORRECTION

PATENT NO. : 10,784,455 B2
APPLICATION NO. : 15/871560
DATED : September 22, 2020
INVENTOR(S) : Thomas Klun It is certified that error appears in the above-identified patent and that said Letters Patent is hereby corrected as shown below:

In the Specification

Column 6
Line 66, Delete "terafluoroethylene" and insert -- tetrafluoroethylene --, therefor.

Column 7
Line 6, Delete "napthalate" and insert -- naphthalate --, therefor.

Column 8
Line 2, Delete "Chemcal" and insert -- Chemical --, therefor.
Lines 9-35, Delete "(Shaw et al.), 5,032,461(Shaw et al.), 5,097,800 (Shaw et al.), 5,125,138 (Shaw et al.), 5,440,446 (Shaw et al.), 5,547,908 (Furuzawa et al.), 6,045,864 (Lyons et al.), 6,231,939 (Shaw et al. and 6,214,422 (Yializis); in PCT International Publication No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum Deposited Polymer/Metal Multilayer Films for Optical Application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).", Society of Vacuum Coaters 39th Annual Technical Conference Proceedings (1996)." and insert the same on Column 8, Line 8, as a continuation of the same paragraph.

Signed and Sealed this
Thirteenth Day of September, 2022

Katherine Kelly Vidal
*Director of the United States Patent and Trademark Office*

Columns 10-11
Lines 61-67 (Column 10), Lines 1-4 (Column 11), Delete "In order to promote silane bonding to the oxide surface, it is desirable to form hydroxyl silanol (Si—OH) groups on a freshly sputter deposited silicon dioxide (SiO2) layer. The amount of water vapor present in a multi-process vacuum chamber can be controlled sufficiently to promote the formation of Si-OH groups in high enough surface concentration to provide increased bonding sites. With residual gas monitoring and the use of water vapor sources the amount of water vapor in a vacuum chamber can be controlled to ensure adequate generation of Si—OH groups." and insert the same on Column 10, Line 62, as the new paragraph.

Column 12
Lines 8-9 (approximately), Delete "minopropyltriethoxy" and insert -- aminopropyltriethoxy --, therefor.

Column 16
Line 47, Delete "acryol" and insert -- acryloyl --, therefor.

Figure 2:
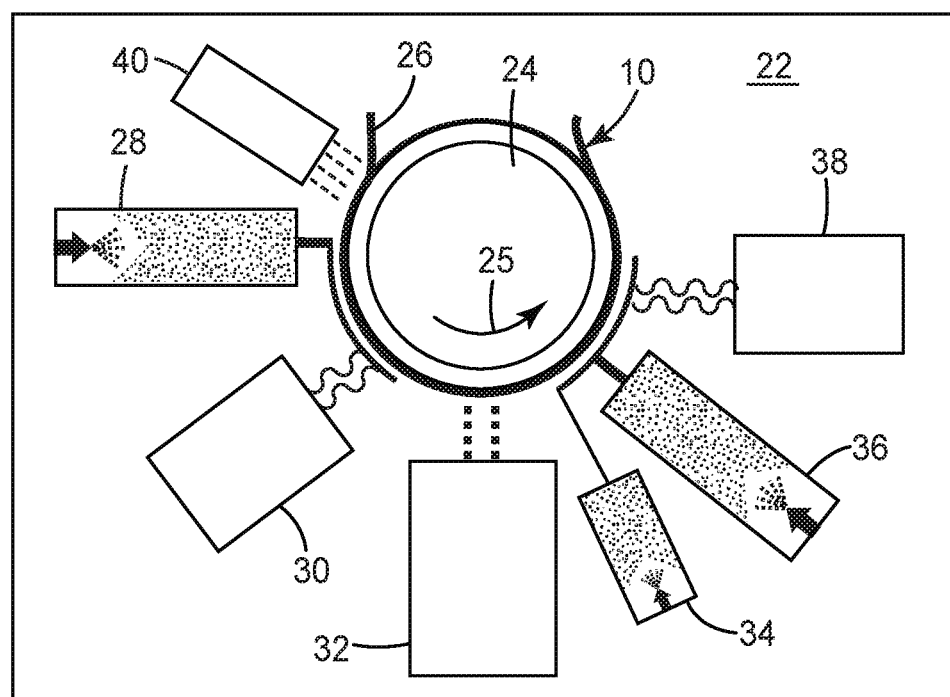
FIG. 2 is a diagram illustrating an exemplary process for making a barrier film according to an exemplary embodiment of the present disclosure.

Column 18
Line 66, Delete "polymerFIG. 2" and insert -- polymer FIG. 2 --, therefor.

Column 23
Line 2, Delete "m $^{-i}$" and insert -- $m^{-1}$ --, therefor.

Column 24
Line 7, Delete "roundbottom" and insert -- round bottom --, therefor.
Line 46, Delete "roundbottom" and insert -- round bottom --, therefor.
Line 60, Delete "roundbottom" and insert -- round bottom --, therefor.

Column 25
Line 20, Delete "roundbottom" and insert -- round bottom --, therefor.

Column 26
Line 17, Delete ""INISIGHT" and insert -- "INSIGHT --, therefor.

Column 29
Line 18, Delete "Example 3and" and insert -- Example 3 and --, therefor.

In the Claims

Column 33
Line 40, In Claim 3, delete "napthalate" and insert -- naphthalate --, therefor.

Column 34
Line 62, In Claim 16, delete "top protective" and insert -- protective --, therefor.